(12) United States Patent
Geaghan et al.

(10) Patent No.: US 10,753,746 B2
(45) Date of Patent: Aug. 25, 2020

(54) MULTI-MODE STYLUS AND DIGITIZER SYSTEM

(71) Applicant: 3M INNOVATIVE PROPERTIES COMPANY, St. Paul, MN (US)

(72) Inventors: Bernard O. Geaghan, Salem, NH (US); Michael W. Dolezal, Stillwater, MN (US)

(73) Assignee: 3M Innovative Properties, Inc., St. Paul, MN (US)

( * ) Notice: Subject to any disclaimer, the term of this patent is extended or adjusted under 35 U.S.C. 154(b) by 1110 days.

(21) Appl. No.: 13/713,032

(22) Filed: Dec. 13, 2012

(65) Prior Publication Data
US 2014/0145066 A1 May 29, 2014

Related U.S. Application Data

(60) Provisional application No. 61/731,030, filed on Nov. 29, 2012.

(51) Int. Cl.
*G01C 21/00* (2006.01)
*H01L 31/12* (2006.01)
*G06F 3/03* (2006.01)

(52) U.S. Cl.
CPC .......... *G01C 21/00* (2013.01); *G06F 3/0317* (2013.01); *G06F 3/0321* (2013.01); *H01L 31/12* (2013.01)

(58) Field of Classification Search
CPC .......... G06F 3/033; G06F 3/0317; G01J 5/10; H01J 40/14; H01L 31/12; G01C 21/00
See application file for complete search history.

(56) References Cited

U.S. PATENT DOCUMENTS

| 3,971,065 A | 7/1976 | Bayer |
| 4,794,634 A | 12/1988 | Torihata |
| 5,051,763 A | 9/1991 | Yukevich, Jr. |
| 5,442,147 A | 8/1995 | Burns |
| 5,477,012 A | 12/1995 | Sekendur |
| 5,552,147 A | 9/1996 | Znaiden |
| 5,675,129 A | 10/1997 | Burns |
| 5,852,434 A | 12/1998 | Sekendur |
| 6,050,490 A | 4/2000 | Leichner |

(Continued)

FOREIGN PATENT DOCUMENTS

| CA | 2 499 917 | 4/2004 |
| EP | 0 110 5769 | 6/1984 |

(Continued)

OTHER PUBLICATIONS

U.S. Appl. No. 13/545,066—Digitizer for Multi-Display System, filed Jul. 10, 2012.

(Continued)

*Primary Examiner* — Georgia Y Epps
*Assistant Examiner* — Don Williams
(74) *Attorney, Agent, or Firm* — Clifton F. Richardson; Steven A. Bern

(57) ABSTRACT

A digitizer system includes a substrate with indicia that uniquely define local areas of the substrate. A multi-mode sensor device, such as a stylus, may sense radiation emitted from the features, and selectively switch to a mode of operation that can sense the indicia and determine therefrom the location of the stylus relative to the substrate.

29 Claims, 11 Drawing Sheets

(56) References Cited

U.S. PATENT DOCUMENTS

| | | | |
|---|---|---|---|
| 6,377,249 B1 * | 4/2002 | Mumford | G06F 3/03542 |
| | | | 345/173 |
| 6,454,482 B1 * | 9/2002 | Silverbrook | B41J 2/17503 |
| | | | 346/140.1 |
| 6,502,756 B1 | 1/2003 | Fahraeus | |
| 6,548,768 B1 | 4/2003 | Pettersson | |
| 6,570,104 B1 | 5/2003 | Ericson | |
| 6,586,688 B2 | 7/2003 | Wiebe | |
| 6,663,008 B1 | 12/2003 | Pettersson | |
| 6,666,376 B1 | 12/2003 | Ericson | |
| 6,667,695 B2 | 12/2003 | Pettersson | |
| 6,689,966 B2 | 2/2004 | Wiebe | |
| 6,722,574 B2 | 4/2004 | Skantze | |
| 6,792,165 B1 | 9/2004 | Silverbrook | |
| 6,927,916 B2 | 8/2005 | Craven-Bartle | |
| 6,962,450 B2 | 11/2005 | Brouhon | |
| 6,965,377 B2 | 11/2005 | Yanagisawa | |
| 7,262,764 B2 | 8/2007 | Wang | |
| 7,330,605 B2 | 2/2008 | Wang | |
| 7,403,658 B2 | 7/2008 | Lin | |
| 7,490,779 B2 | 2/2009 | Shinozaki | |
| 7,528,848 B2 | 5/2009 | Xu | |
| 7,553,537 B2 | 5/2009 | Wang | |
| 7,570,813 B2 | 8/2009 | Wang | |
| 7,580,576 B2 | 8/2009 | Wang | |
| 7,619,607 B2 | 11/2009 | Zhang | |
| 7,622,182 B2 | 11/2009 | Wang | |
| 7,646,377 B2 | 1/2010 | Geaghan | |
| 7,672,513 B2 | 3/2010 | Björklund | |
| 7,756,364 B2 | 7/2010 | Slatter | |
| 7,872,641 B2 * | 1/2011 | Abileah | G02F 1/13338 |
| | | | 345/104 |
| 7,898,505 B2 | 3/2011 | Blythe | |
| 9,367,151 B2 | 6/2016 | McKillop et al. | |
| 2002/0163511 A1 | 11/2002 | Sekendur | |
| 2003/0085868 A1 | 5/2003 | Paul et al. | |
| 2003/0197690 A1 | 10/2003 | Zimenkov | |
| 2004/0085302 A1 | 5/2004 | Wang | |
| 2004/0086181 A1 | 5/2004 | Wang | |
| 2005/0162400 A1 | 7/2005 | Tseng | |
| 2005/0201621 A1 | 9/2005 | Wang | |
| 2006/0022963 A1 | 2/2006 | Bosch | |
| 2006/0028457 A1 * | 2/2006 | Burns | G06F 3/0421 |
| | | | 345/179 |
| 2006/0055763 A1 | 3/2006 | Matsunoshita | |
| 2006/0139338 A1 | 6/2006 | Robrecht | |
| 2006/0221022 A1 | 10/2006 | Hajjar | |
| 2006/0232569 A1 | 10/2006 | Lin | |
| 2007/0084932 A1 | 4/2007 | Shinozaki | |
| 2007/0097101 A1 | 5/2007 | Hunter | |
| 2008/0018619 A1 | 1/2008 | Slatter | |
| 2008/0066973 A1 | 3/2008 | Furuki | |
| 2008/0246388 A1 | 10/2008 | Cheon | |
| 2009/0017268 A1 | 1/2009 | Skipor | |
| 2009/0128520 A1 | 5/2009 | Combe | |
| 2010/0001962 A1 | 1/2010 | Doray | |
| 2010/0001963 A1 | 1/2010 | Doray | |
| 2010/0085471 A1 | 4/2010 | Craven-Bartle | |
| 2010/0328272 A1 | 12/2010 | Craven-Bartle | |
| 2011/0115750 A1 | 5/2011 | Ebner | |
| 2011/0141150 A1 | 6/2011 | Hajjar | |
| 2012/0127110 A1 | 5/2012 | Amm | |
| 2012/0162145 A1 | 6/2012 | Knee | |
| 2012/0176311 A1 * | 7/2012 | Bittenson et al. | 345/158 |
| 2013/0334441 A1 * | 12/2013 | Croft | G02B 5/208 |
| | | | 250/458.1 |
| 2014/0001268 A1 | 1/2014 | Lee et al. | |

FOREIGN PATENT DOCUMENTS

| | | |
|---|---|---|
| EP | 0 670 555 | 9/1995 |
| JP | 2005-006066 | 1/2005 |
| JP | 2007245526 | 9/2007 |
| JP | 2008-305216 | 12/2008 |
| JP | 2009043218 | 2/2009 |
| JP | 2011022947 | 2/2011 |
| JP | 2011073353 | 4/2011 |
| WO | WO 01/01670 | 1/2001 |
| WO | WO 01/26032 | 4/2001 |
| WO | WO 02/058029 | 7/2002 |
| WO | WO 2005/010823 | 2/2005 |
| WO | WO 2006/104291 | 10/2006 |
| WO | WO 2012/102690 | 8/2012 |

OTHER PUBLICATIONS

Bakueva et al., "PbS Quantum Dots With Stable Efficient Luminescence in the Near-IR Spectral Range", Advnced Materials, 2004, vol. 16, No. 11, Jun. 4, 2004, pp. 926-929.

Dorokhin et al., "Fabrication and Luminescence of Designer Surface Patterns with β-Cyclodextrin Functionalized Quantum Dots via Multivalent Supramolecular Coupling", Institute of Materials Research and Engineering, Agency for Science, Technology and Research, American Chemical Society Nano, 2010, vol. 4(1), pp. 137-142.

Grund Jr. et al., "Quantum Dot Composite Light Sources", Proceedings vol. 7953, Novel In-Plane Semiconductor Lasers X, edited by Alexey A. Belyanin, Peter M. Smowton, 7950302, Feb. 16, 2011, 5 pages.

Hampton et al.; "Direct Patterning of CdSe Quantum Dots into Sub-100 nm Structures", Langmuir Letter, 2010, 26(5), pp. 3012-3015.

Mukhametzhanov et al.; "Room Temperature Electroluminescence at 1.3μm From Strained InAs/GaAs Quantum Dots", Photonic Materials and Devices Laboratory, Departments of Materials Science and Physics, university of Southern California, Los Angeles, California 90089-0241, Issue Date: 1999, Meeting Date: Nov. 8, 1999—Nov. 11, 1999, vol. 1, pp. 305-306.

Panzer et al.; "Tunable Infrared Emission From Printed Colloidal Quantum Dot/Polymer Composite Films on Flexible Substrates", Journal of Display Technology, vol. 6, No. 3, Mar. 2010, pp. 90-93.

Pietryga et al.; "Pushing the Bank Gap Envelope: Mid-Infrared Emitting Colloidal PbSe Quantum Dots", Journal of American Chemical Society, vol. 126, No. 38, 2004, pp. 11752-11753.

Sargent E. H.,; "Infrared Quantum Dots", Advanced Materials, vol. 17, No. 5, Mar. 8, 2005, pp. 515-522.

Singh et al.; "Inkjet Printing—Process and Its Applications", Advanced Materials vol. 22, 2010, pp, 673-685.

Small, A.C.; Johnston, J. H., and Clark, N.; "*Inkjet Printing of Water "Soluble" Doped ZnS Quantum Dots*", European Journal of Inorganic Chemistry, 2010; pp. 242-247.

Quantum-Dot Displays: Dotting the Eyes, The Economist, How Tiny Crystals Can Improve Picture Quality, Jun. 16, 2011—from the print edition, Printed. Jan. 11, 2013. http://www.economist.com/node/18833511/print, 3 pages.

International Search Report for PCT/US2013/069418, dated Apr. 4, 2014, 4 pp.

\* cited by examiner

MULTI-MODE STYLUS AND DIGITIZER SYSTEM

BACKGROUND

Users are increasingly demanding functionalities beyond merely recognizing a touch to the surface of the touch-sensitive device. Such other functionalities include handwriting recognition and direct note taking (using, for example, a stylus). Such functionalities are generally provided in so-called digitizing systems.

Digitizing systems having position-dependent indicia detected by an image sensor in a stylus are commercially available. Anoto Group AB sells a stylus that detects indicia printed on an opaque paper or cardboard substrate. Reference is made to US Patent Publication No. 2010/0001962 (Doray), which describes a multi-touch display system that includes a touch panel having a location pattern included thereon.

SUMMARY

A multi-mode sensing device, such as a stylus, that supports a plurality of operational sensing modes, the modes being consistent with various types of location indicia. For example, in one mode, the stylus illuminates a field of view with light in a first illumination wavelength range that stimulates photoluminescence, and photoluminescent images are detected by an image detector that is responsive to wavelengths in a second indicia wavelength range that is substantially different from the first illumination wavelength range. In a second mode, the stylus provides illumination in a wavelength range, and the stylus detects non-photoluminescent images in the same wavelength range as the stylus illumination. In a third mode, the stylus may detect indicia radiating light in a first indicia wavelength range from a visible light emitting display. In some embodiments, the stylus image sensor and stylus processor may sense two or more wavelength ranges and discriminate between images in each wavelength range.

These and other embodiments are described further herein.

BRIEF SUMMARY OF DRAWINGS

Embodiments described herein may be more completely understood in consideration of the following detailed description in connection with the accompanying drawings, in which.

In the figures, like reference numerals designate like elements, unless otherwise described.

DETAILED DESCRIPTION OF ILLUSTRATIVE EMBODIMENTS

Figure 1A:
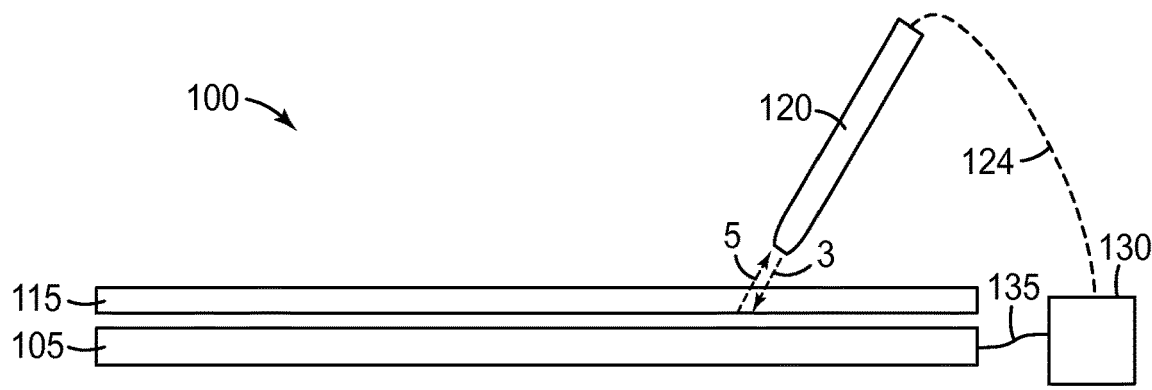
FIG. 1a shows a digitizer and display system.

A digitizer system is described herein that includes a substrate having photoluminescent indicia that uniquely define an X-Y area of the substrate, and a pen or stylus with optical sensor that sense the indicia and determine based on the sensed indicia the position of the stylus relative to the substrate.

One pattern of indicia suited to embodiments described herein has been developed by, and is available from, Anoto Company AB, of Sweden. Anoto provides companies the ability to print small, opaque dots on paper in a pattern that uniquely defines each location on the paper. A stylus, that they also provide, is then used to sense portions of the pattern passing within the stylus field-of-view (FOV). The sensed pattern is then analyzed and the position of the stylus relative to the paper is computed.

Such analysis may comprise subjecting the sensed pattern to an image recognition algorithm whereby the sensed image is analyzed with a mathematical function that defines shapes or patterns, and/or with compared against a library of indicia. Within such a library are definitions of a large number of supported indicia and an indicator of the relative location of each indicium relative to other indicia. Identifying one indicium provides an indication of location on the surface of a digitizer. If digitizer locations have been predetermined relative to display coordinates, then indicia can be used to indirectly reference display coordinates. Identification of orientation (for example the rotation) of indicia relative to a stylus may also provide information about the orientation of the stylus.

As described further herein, the use of photoluminescent indicia, in some embodiments, allows for the substrate and the indicia to be highly light transmissive to human visible light, even to the point of being nearly transparent, such that it is well suited for use as a transparent overlay to be put on or incorporated into a display. Photoluminescent indicia could also be used on non-light-transmissive substrates, including opaque substrates (such as whiteboards or paper). A multi-wavelength pattern is also described herein.

Photoluminescent indicia also, in some embodiments, may improve the signal to noise ratio in a detection system. They may also provide improved handling of specular reflection from the substrate. In some embodiments, radiation from the excitation source can be reduced or eliminated at the detector by the use of an optical filter, thereby improving the detection of the photoluminescent qualities of the indicia. In particular, since photoluminescent indicia, in some embodiments, upon receiving excitation electromagnetic illumination (or radiation—the terms are used interchangeably herein) in a first wavelength range (usually in the form of ultraviolet (UV), visible, or infrared (IR) illumination), the indicia luminesce providing emitted electromagnetic radiation in one or more wavelength ranges different than the excitation range.

In some embodiments, signals associated with the excitation radiation source can be filtered out, thereby increasing the signal-to-noise ratio in the light received by the sensor from the luminescent indicia. The material of the substrate itself may also be selected, in some embodiments, to improve signal-to-noise ratios. For example, in a photoluminescent indicia detection system, the substrate with the indicia could be placed on an absorbing material, a diffusing material, or a transparent material in order to minimize excitation radiation returning to the sensor.

The material comprising the photoluminescent indicia may be selected based on properties of the substrate, as will be described more fully later. In some embodiments, the material may comprise photoluminescent inks available in the marketplace, or quantum dots (QDs). The photoluminescent material is configured to exhibit photoluminescence; in one embodiment the luminescent emissions provided by the indicia is primarily in the infra-red (IR) light wavelengths, and the "stimulating" excitation illumination is primarily in wavelengths shorter than those associated with IR. There may be some overlap in the light wavelength ranges used to excite the indicia as compared with that provided by the emission of the material, but in some embodiments less overlap is desirable. The photoluminescent material may be transmissive or transparent to visible light, and may be disposed on a substrate that itself is transmissive or transparent to visible light.

In some embodiments, the digitizer system may be configured to operate in one of several modes. In one mode, the stylus illuminates a field of view with light in a first illumination wavelength range that excites the photoluminescent indicia, and images are detected by an image detector, or sensor, that is responsive to emission wavelengths in a second indicia wavelength range that is substantially different from the first illumination wavelength range. In a second mode, the stylus provides illumination in a wavelength range, and the stylus detects non-photoluminescent images in the same wavelength range as the stylus illumination. In a third mode, the stylus may detect indicia radiating light in a first indicia wavelength range from a visible light emitting display. In some embodiments, the stylus image sensor and stylus processor may sense two or more wavelength ranges and discriminate between images in each wavelength range.

FIG. 1a shows stylus digitizer system 100 comprising stylus 120, display 105, digitizer panel 115 patterned with photoluminescent indicia, and electronic controller 130 that controls displayed images via link 135. Controller 130, comprised of various microprocessors and circuitry, controls displayed images via link 135, or it may be communicatively coupled to another display-specific controller that controls displayed images. Display controller 130 receives signals from stylus 120 associated with the position of stylus 120 relative to digitizer panel 115. Controller 130 may also serve as the system processor for a computer system, for example a portable computing system. Though controller 130 is shown as one box in FIG. 1, it may exist as discrete electronic sub-systems, for example, a first sub-system to interact with stylus 120, and a second sub-system to interact with display 105. Stylus 120 is communicatively coupled with controller 130 by link 124. Link 124 may be a bundle of thin wires, but more preferably link 124 is a wireless radiofrequency (RF) link, and in such a construction stylus 120 and controller 130 include radios for back-and-forth communication, or, depending on implementation, one way communication. Such radios in one embodiment implement the Bluetooth™ communications protocol, or that defined by IEEE 802.11.

Another electronic subsystem could be configured to time the excitation source and the sensing unit (for example, stylus). For example, the excitation source could be pulsed (on/off) and the sensor capture timing set to correspond to the off state of the source. This configuration could be useful in some embodiments for indicia based on phosphorescent material or other photoluminescent material with a suitably long decay time.

In some embodiments, pulsed operation of the source/detection system would also mitigate motion induced artifacts in a moving stylus system. If the capture time were sufficiently short, the blurring of the indicia in the captured image would be minimal, possibly allowing for more accurate reading of the indicia. In addition, there may be a reduction in the rate of photoluminescent bleaching as compared to operation of the source in a continuous mode. Pulsed mode operation may also extend the operating time for battery powered stylus devices.

Stylus 120 has an optical image sensor that can detect patterns of light within its field of view (FOV). Stylus 120 detects light 5 emitted from photoluminescent indicia disposed on or within digitizer panel 115. Stylus 120 may provide stimulating, or excitation, illumination in the form of excitation light 3 to illuminate indicia on digitizer panel 115. In other embodiments, excitation illumination may come from sources other than those housed within the stylus (for example, LCD backlights and ambient light). Excitation light 3 may have a first wavelength range; indicia emitted light 5 (luminescence) has a second wavelength range. The first and second wavelength ranges in one embodiment do not overlap. In another embodiment the first and second wavelength ranges minimally overlap such that most of the excitation illumination energy is at different wavelengths than most of the indicia emitted energy. In another embodiment, the first and second wavelength ranges overlap. In yet another embodiment, emitted light 5 may be emitted from a visible display so no excitation light 3 may be required. In some embodiments, the second wavelength range of light will comprise a plurality of wavelength combinations that may be discriminated from one another by the optical image sensor in stylus 120. In most cases where indicia are fluorescent or phosphorescent, the first illumination wavelength range will be at shorter wavelengths than the second indicia wavelength range. The breadth of the first and the second wavelength ranges will be based on the nature of the photoluminescent indicia. The first and/or the second wavelength ranges may be beyond those associated with human ocular sensing.

Display 105 may be any type display including but not limited to electronically addressable displays such as liquid crystal displays (LCD), active matrix LCD (AMLCD), organic light emitting diode displays (OLED), active matrix organic light emitting diode displays (AMOLED), electrophoretic display, a projection display, plasma displays, or a printed static image. Display 105 is, in some embodiments, optional, as the digitizer may be used in applications where digitizer panel 115 is opaque.

Digitizer panel 115 is in one embodiment a transparent substrate, such as glass, polyethylene terephthalate (PET), polyethylene naphthalate (PEN) cellulose triacetate (TAC), or any suitable material. It may be fully light transmissive, partially light transmissive, or opaque. Preferably, it is highly light transmissive so as to allow a person to see the output of display 105. Digitizer panel 115 may be one layer or may be comprised of multiple layers of various materials. Digitizer panel 115 includes, disposed upon or within it, photoluminescent indicia that uniquely define the substrate or some portion of the substrate, in two dimensions. Digitizer panel 115 may comprise more than one layer. For example, a durable layer may be used on the top surface. Anti-reflective (AR), anti-glare (AG), polarizing, color filtering, light reflecting, or dichroic optical layers may be included. Touch screen electrodes or resistive surfaces may be included, as well as adhesive layers used to laminate various layers of panel 115. Panel 115 may be rigid or flexible.

Anoto Company AB, of Sweden, licenses software that allows companies to print opaque indicia in the form of ink on, for example, paper. Anoto also sells pens that recognize the indicia and thereby determine the X-Y coordinates of the pen relative to the printed paper.

Indicia and sensing techniques based on various patterns are further described in U.S. Pat. Nos. 5,051,763; 5,442,147; 5,477,012; 5,852,434; 6,502,756; 6,548,768; 6,570,104; 6,586,688; 6,663,008; 6,666,376; 6,667,695; 6,689,966; 6,722,574; and 7,622,182, each of which is hereby incorporated by reference in its entirety. Anoto is one company that has developed location unique indicia-based digitizer systems; other systems will be known by the skilled artisan, and inventions described herein may be applicable to many of them.

For digitizers that operate overlaid upon a display, indicia that produce indicia emitted light outside the visible range may be preferable. Indicia for such applications are preferably formed of any suitable material that provides emitted photoluminescence at wavelengths between 700 and 1000 nm. Such materials are readily available, as are IR filters and optical sensors that operate in this range. For example, Hamamatsu Photonics of Hamamatsu City, Japan, sells several charge-coupled device (CCD) optical sensors sensitive to IR wavelength ranges. For some applications, other wavelength ranges, such as longer IR wavelength ranges, may be preferable.

Any suitable photoluminescent material may be used for indicia. In one embodiment, a suitable indicia material comprises photoluminescent inks. Some example photoluminescent inks and dyes are available from QCR Solutions Corp, of Port St Lucie Fla. (see dyes including IRF820A and IRF940A).

In another embodiment, photoluminescent quantum dots may be embedded in a carrier material, such as a resin or liquid, to make a dye. Quantum dots, in some embodiments, luminesce when exposed to excitation light provided over a wider range of wavelengths from UV to IR, which is not true for many other luminescent materials. Thus, quantum dots may be particularly suited for, for example, system 102 (FIG. 1c and FIG. 4d) where a quantum dot luminescent material can absorb energy from a white LCD backlight. Other luminescent materials may require a special backlight for system 102 that emits light in their specific absorption range.

There exists a wide variety of commercially available quantum dot options. Quantum dots can be selected as to provide indicia emitted light with a variety of wavelengths from the ultraviolet (for example, quantum dots comprised of ZnSe) through the visible (for example, quantum dots comprised of CdSe), and into the mid IR (>2500 nm) (for example, comprised of PbSe. Quantum dots that provide indicia emitted light in the IR range may also be made of PbS, PbSe, or InAs. Quantum dots made of PbS having diameters from about 2.7 to 4 nm will provide indicia emitted light in the near IR range of wavelengths. Quantum dots with a core of InAs and a shell of higher band gap material, for example ZnSe or PbSe with an inorganic passivation shell of CdSe, may have improved photoluminescence quantum efficiencies. Quantum dots having core of CdTeSe with a ZnS shell are commercially available from Nano Optical Materials of Torrance, Calif. Quantum dots stabilized with a combination of thioglycerol and dithioglycerol have also been shown to improve stability of luminescence wavelength over time. Quantum dots may be purchased commercially from companies including Nano Optical Materials, NOM's parent company Intelligent Optical Systems (also of Torrance, Calif.), and Evident Technologies of Troy, N.Y. Evident Technology markets a PbS based dye with the name "Snake Eye Red 900" that may be formulated into an ink for printing. Life Technologies, of Grand Island, N.Y., and Nanosys, of Palo Alto, Calif. offer printable quantum dot solutions, for example anti-counterfeit inks containing quantum dots.

Indicia may be printed onto any suitable substrate, as mentioned above. Many known printing processes may be used, including flexographic, gravure, ink jet, or microcontact printing. Photoluminescent material may be dispersed homogeneously into an optically clear resin and deposited on a substrate using methods such as flexographic or gravure printing. Gravure printing may be preferable for printing larger photoluminescent particles such as IRF820A. Flexographic printing may have cost advantages in high volume applications. Inkjet printing may be preferred where smaller volumes of customized patterns of indicia are desired. Inkjet printing of quantum dots is described in the articles: Small, A. C., Johnston, J. H. and Clark, N., *Inkjet Printing of Water "Soluble" Doped ZnS Quantum Dots*, European Journal of Inorganic Chemistry, 2010: pp. 242-247.

Printing of indicia in a thin layer is generally preferable in embodiments where indicia are printed on a substrate that overlays a display, because refraction of light through the indicia can be minimized. Transparency can also be maximized by thinner layers and in some cases luminescence quenching can be reduced. Photoluminescent quantum dots can be printed in a monolayer using micro-contact printing. A monolayer of quantum dots maximizes transparency to visible and IR wavelengths. In doing so, visible light transmission is maximized along with reflection of indicia-generated IR light (5a, 6a in FIG. 4b, 4d).

Monolayers of quantum dots may be printed using microcontact printing methods described in the article *Direct Patterning of CdSe Quantum Dots into Sub-100 nm Structures* (Small, A. C., et. al., European Journal of Inorganic Chemistry (2010): pp. 242-247), and the article *Fabrication and Luminescence of Designer Surface Patterns with β-Cyclodextrin Functionalized Quantum Dots via Multivalent Supramolecular Coupling* (Dorokhin, et. al., Institute of Materials Research and Engineering, Agency for Science, Technology and Research, ACS Nano (2010), 4 (1), pp. 137-142. The latter of these articles describes two methods of microcontact printing luminescent CdSe/ZnS core-shell quantum dots. In both methods, quantum dots are functionalized by coating with surface ligands of β-cyclodextrin that promote binding, and stabilize the quantum dots in a water-based colloidal suspensions. In both methods, polydimethylsiloxane (PDMS) stamps are used for micro-contact printing onto glass substrates. In one method, a substrate is first microcontact-printed with a pattern of adamantyl terminated dendrimeric material, then a colloidal suspension of functionalized quantum dots are exposed to the printed substrate, and quantum dots bind to the material printed on the substrate. In a second method, functionalized quantum dots are directly microcontact printed onto a dendrimer layer on a glass substrate.

Depending on the photoluminescent pattern required, microreplication can be used to make a tool with a negative of the desired pattern. The tool is then pressed and cured against a uniformly coated polymer layer to form consistent dents of the pattern in a polymer cured matrix. These dents can then be filled either directly with the a suitable photoluminescent material blended with a carrier or formulated into an ink using precision roll coating methods such as gravure printing, or, indirectly by using roll coating in combination with doctor-blading to remove excessive solution from areas other than within the dents.

Another way of patterning the substrate is to use a direct thermal printing process with a photoluminescent ink so that the ink resides within the well formed in the (typically polymeric) substrate by the thermal printing mechanism. This may have the added advantage of rapid single step digital processing that can provide custom patterns without, in some embodiments, the need for costly tool development.

Photoluminescent indicia can be created using either organic or inorganic dyes or pigments depending on the nature of the application. Organic dyes, such as CY7 which is available from Lumiprobe of Hallandale, Fla., provide several benefits such as high luminescence. However, the Stokes shift for these types of dyes is typically <50 nm and the durability and light-fastness are often low, making them unsuitable for some applications. Carbon chains with conjugated bonds or aromatic rings are typical present in organic dyes, and are sometimes associated with nitrogen or sulfur atoms. For example, CY7 consists of a cyclohexane-bridged polymethyne chain.

Inorganic dyes, pigments, phosphors or other luminescent materials, such as the earlier mentioned Snake Eye Red provide another solution. The Stokes shifts for these materials can be relatively high due to the large bandwidth of the absorption curves compared to organic dyes. These materials consist of the cations of metal in an array with the non-metallic ions, such as lead-sulfide (PbS) in Snake Eye Red.

Figure 1B:
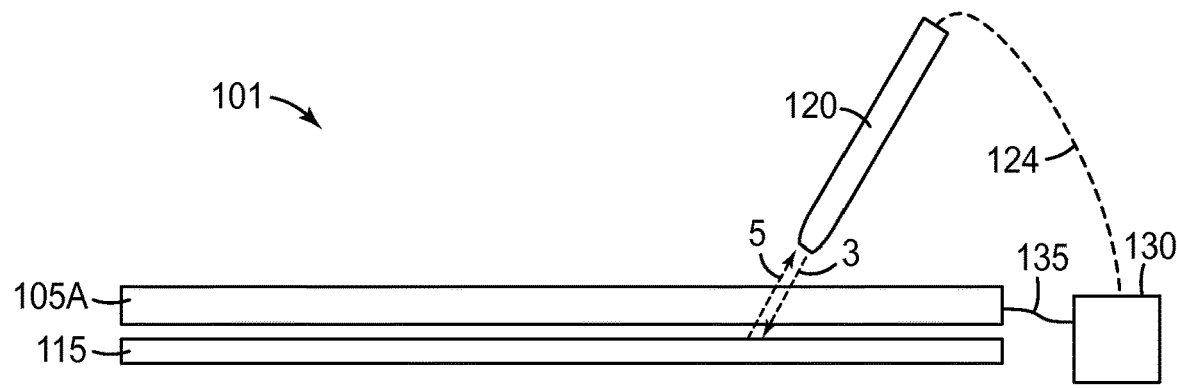
FIG. 1b shows a further embodiment of a digitizer and display system.

Turning now to FIG. 1b, a stylus digitizer system 101 is shown, comprising stylus 120, digitizer panel 115 patterned with photoluminescent indicia, display 105a, and electronic controller 130 that receives position-related information from stylus 120 and controls displayed images via link 135. Display 105a emits or reflects visible light, and display 105a is at least partially transmissive to stylus emitted excitation light 3 and to indicia emitted light 5. Display 105A may be a transparent OLED display, or static printed image, or other display type.

Figure 1C:
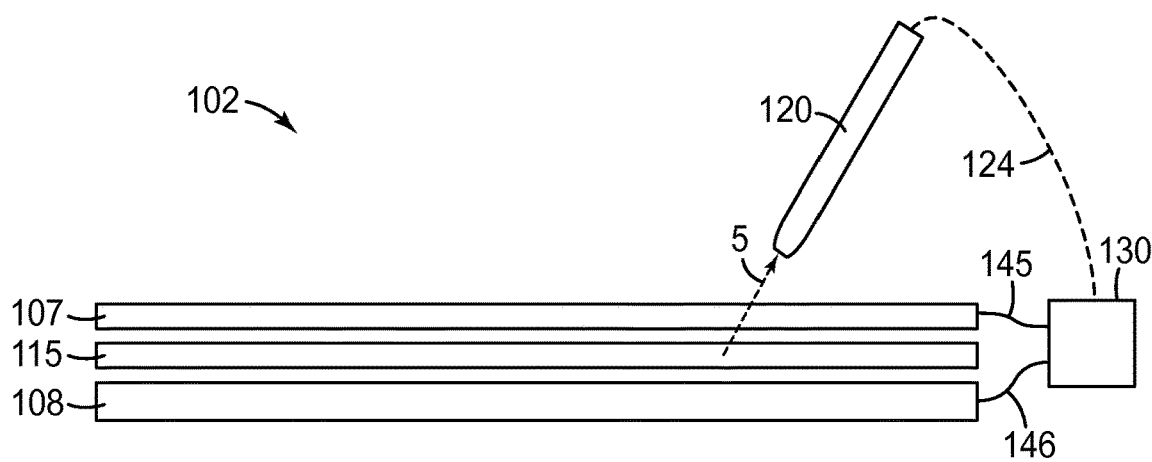
FIG. 1c shows a further embodiment of a digitizer and display system.

Turning now to FIG. 1c, a stylus digitizer system 102 is shown, comprising stylus 120, digitizer panel 115 with photoluminescent indicia, LCD 107, backlight 108, and electronic controller 130 that receives position-related information from stylus 120 and controls displayed images via link 145. Stylus 120 detects patterns of light 5 emitted from indicia on digitizer panel 115. Indicia emitted light 5 preferably has a different wavelength range than visible light emitted from backlight 108. Indicia emitted light 5 preferably has a wavelength range including wavelengths sufficiently long such that they penetrate LCD 107 regardless of the On/Off state of the pixels in LCD 107. For example, 950 nm light penetrates most LCDs regardless of pixel state. Indicia on digitizer panel 115 may be energized by excitation light from backlight 108, so an indicia exciting light source on stylus 120 may be optional and not required.

Figure 1D:
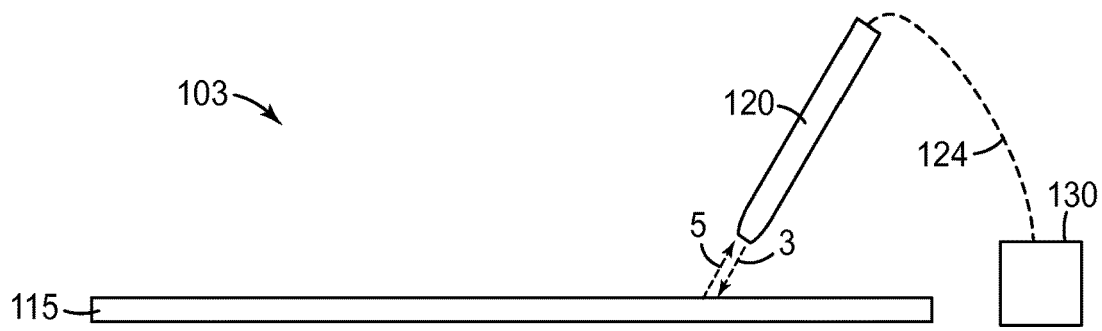
FIG. 1d shows an embodiment of a digitizer absent a display system.

FIG. 1d shows stylus digitizer system 103 comprising stylus 120, digitizer panel 115 with photoluminescent indicia, and electronic controller 130. Stylus 120 illuminates indicia on digitizer panel 115 with excitation light 3 and detects indicia emitted light 5. Digitizer panel 115 may be printed with various graphics, or it may appear blank (as for e.g. a blank sheet of paper), and may be opaque. Stylus 120 may be combined with pen functionality (not shown in FIG. 1d, described with respect to inking tip 52, FIG. 4). Digitizer pane 115 may be a whiteboard, for example as used in a classroom, and the marker may be incorporated into the stylus, or the digitizer pane may comprise a screen onto which a display is projected.

Figure 3A:
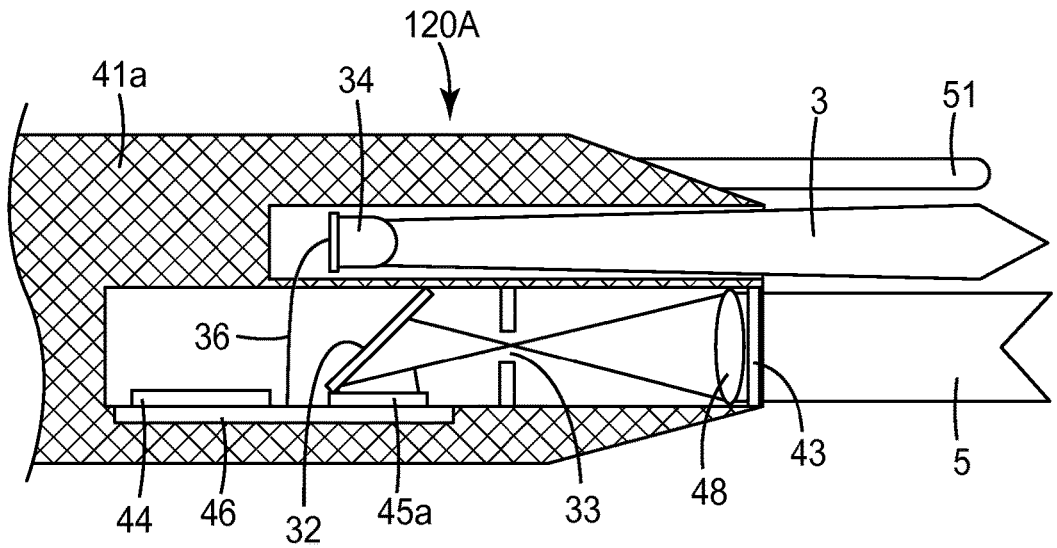
FIG. 3a shows a cross section of the end portion of a stylus.

FIG. 3a shows a cross sectional view of a portion of stylus 120A. Stylus body 41 contains optional light source 34 that may emit excitation light 3 having a first illumination wavelength range. Indicia emitted light 5 having a second indicia wavelength range enters the tip of stylus 120A and is passed through filter 43. Filter 43 selectively passes at least some portion of the second wavelength range of indicia emitted light 5 while blocking light of the first wavelength range (that was emitted by light source 34). For example indicia may emit 800 nm to 1200 nm light and filter 43 may pass light of indicia wavelengths between 750 nm and 1200 nm while blocking light wavelengths below 750 nm. Lens 48 focuses indicia emitted light 5 to pass through aperture 33 then reflect from mirror 32 onto image sensor 45. Lens 48 may be made of IR transparent, visible light blocking material so lens 48 can also perform the filtering function of filter 43. Exemplary lens 48 is shown as a simple convex lens, but other lens configurations may be preferable. In some stylus configurations, lens 48 may be required to focus a wide range of wavelengths onto image sensor 53. Where this is the case, lens 48 may be an achromatic lens.

Image sensor 45 may be any suitable sensor. Sensors based on charge-coupled devices (CCDs) and complementary metal-oxide-semiconductor (CMOS) technologies are used interchangeably in multiple areas of imaging, and may be suitable in this application. In some embodiments, light 5 may have a plurality of indicia wavelength and pattern combinations that uniquely define local regions of a substrate. In these embodiments, image sensor 45 may further include a color filter that passes selected indicia wavelengths of light 5 to some pixels and different wavelengths to other pixels of sensor 45.

Image sensor 45 is connected to stylus processor 44 by conductors on printed circuit board (PCB) 46. Light source 34 is connected to PCB 46a by link 36. Stylus processor 44 controls image sensor 45 and light source 34 via conductors on PCB 46a and by link 36 respectively. In addition, the stylus processor controls collection of image information from image sensor 45 and communicating this to controller 130 via link 124, (shown in FIG. 1a). Stylus 120 may also comprise additional components such as switches and a battery, (not shown). Stylus 120 may also comprise a probe 51 extending from the stylus that provides spacing for the optical components, and may activate a switch upon contact with the surface of the digitizer, causing certain stylus electronics to activate. Probe 51 may be made of solid plastic, or metal, and it may contain ink for writing on a surface with stylus 120. Probe 51 may be optionally retractable.

The illumination wavelength range of light source 34 must provide radiation in a range that excites indicia to produce emission (luminescence) at a desired indicia wavelength and brightness. In one example, indicia emitted light luminesces due to stimulation by light in another, shorter wavelength range. In some embodiments it may be preferable that the excitation light and the indicia emitting light be minimally visible to the user. These criteria are met if light source 34 emits UV-A light, for example between 350 nm and 420 nm or if light source 34 emits near IR light, for example between 700 nm and 850 nm. Excitation light may instead, or in addition, be generated by other components, such as backlights in an LCD panel, or other illumination sources.

Figure 3B:
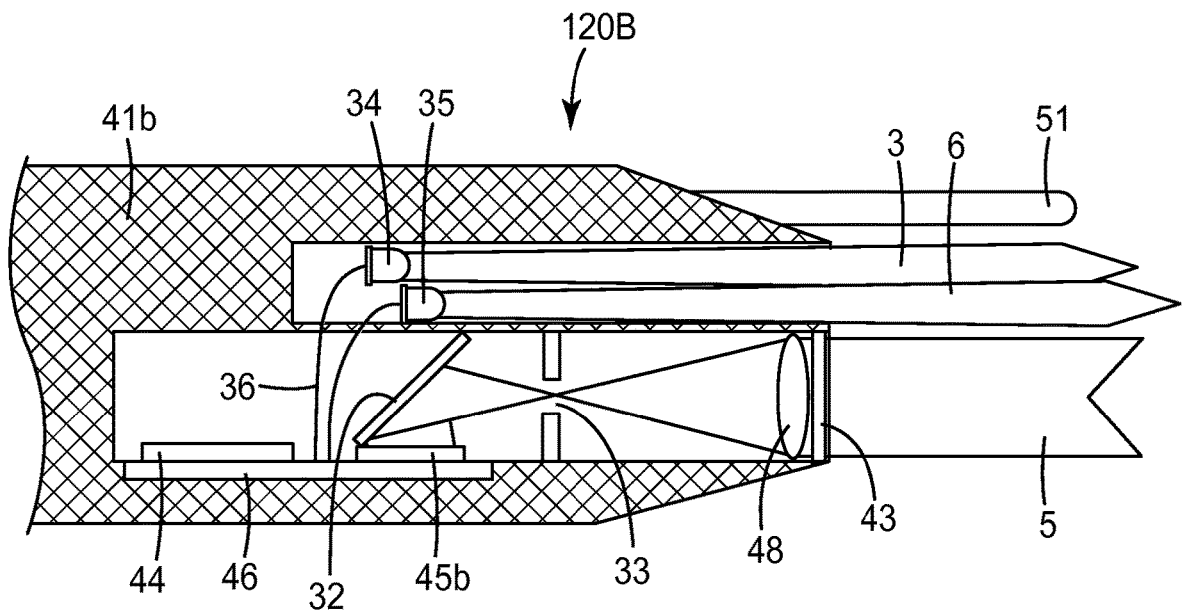
FIG. 3b shows a cross section of the end portion of dual-source stylus.

Stylus 120B (FIG. 3b) is similar to stylus 120A, except it has an additional light source 35. This light source may be beneficially used in stylus embodiments that need to sense both photoluminescent indicia and traditional reflective indicia (the latter commercially available from Anoto). For example, in luminescent mode, processor 44 may select light source 34 to excite indicia with light in the 380 nM wavelength range that then luminesce and emit radiation in an indicia wavelength range centered on 850 nM. Image sensor 45 may be configured to detect images in the indicia wavelength range of 850 nM. In reflecting mode, processor 44 may select source 35 to illuminate indicia that do not luminesce. Source 35 would preferably emit illumination in the indicia wavelength range of 850 nM, so light of this wavelength range will be reflected differently from the indicia relative to their surrounding substrate, and the resulting contrast between indicia-reflected light and substrate-reflected light is detected by image sensor 45.

Figure 3C:
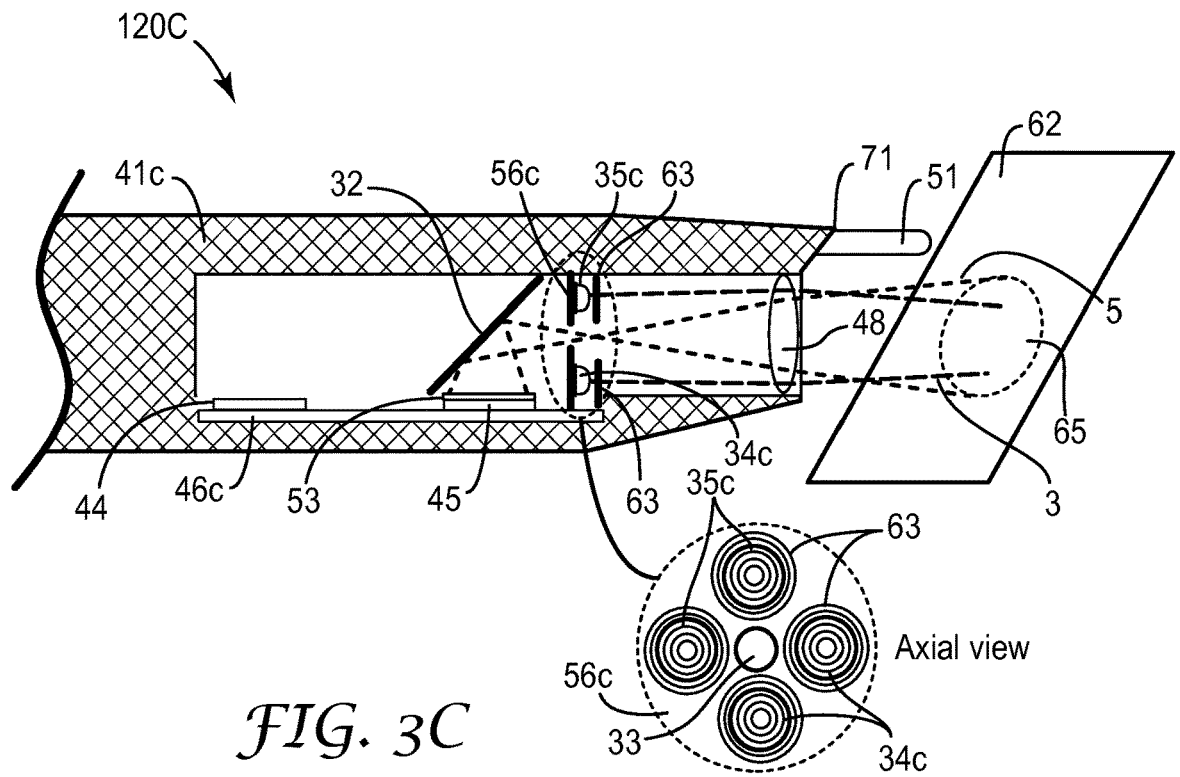
FIG. 3c shows a cross section of the end portion of dual-source stylus with a coaxial optical path and light guide.

FIG. 3c shows a simplified cross sectional view of a portion of stylus 120C that has two light sources like stylus 120A, but with an alternative construction including a common optical path for illumination light 3 and 6, and indicia-emitted light 5. Stylus body 41c contains light sources 34c and 35c that emit illumination light 3 light 6 respectively. Light sources 34c and 35c may have multiple emitters. In the example shown in FIG. 3c axial view, each source comprises two LEDs. Also in the example, light from sources 34c and 35c is focused by a Fresnel lens 63 in front of each of the four LEDs. Light from sources 34c or 35c is focused through objective lens 48c and emitted from stylus 120C, where it may illuminate field of view 62. Light 5 within field of view 62 enters stylus 120C through lens 48c and is focused through an aperture 33 in plate 56c, then reflected on mirror 32. From mirror 32, light 5 passes to color filter 53c where light 5 within a selected wavelength range is passed through filter 53c to image sensor 45c. The common optical path through lens 48c simplifies alignment of outgoing light 3 or 6 with incoming light 5, and minimizes the required tip diameter of stylus 120.

Various operating modes of stylus 120 are described elsewhere herein for illuminating indicia with various wavelengths of light and sensing images of photoluminescent or light-reflecting indicia. In a further mode, stylus 120 may detect images of indicia that radiate light in the visible wavelength range. For example, stylus 120 may sense images formed by pixels of a visible light emitting display, for example, as described in U.S. Pat. No. 7,646,377, which is hereby incorporated by reference in its entirety. Sensing visible images from a light emitting display such as an LCD, OLED, or projection display does not generally require illumination by a stylus light source, so sources 34 and 35 may be turned off by processor 44 when the stylus is in visible light sensing mode. Sensing light in the visible wavelength range requires that image sensor 45 be sensitive to visible wavelengths, and that incoming light 5 passes through filters so it reaches image sensor 45. Any of sensors 45 may be sensitive to visible light. Any of filters 43 or 53, or similar, may pass visible wavelengths.

Figure 3D:
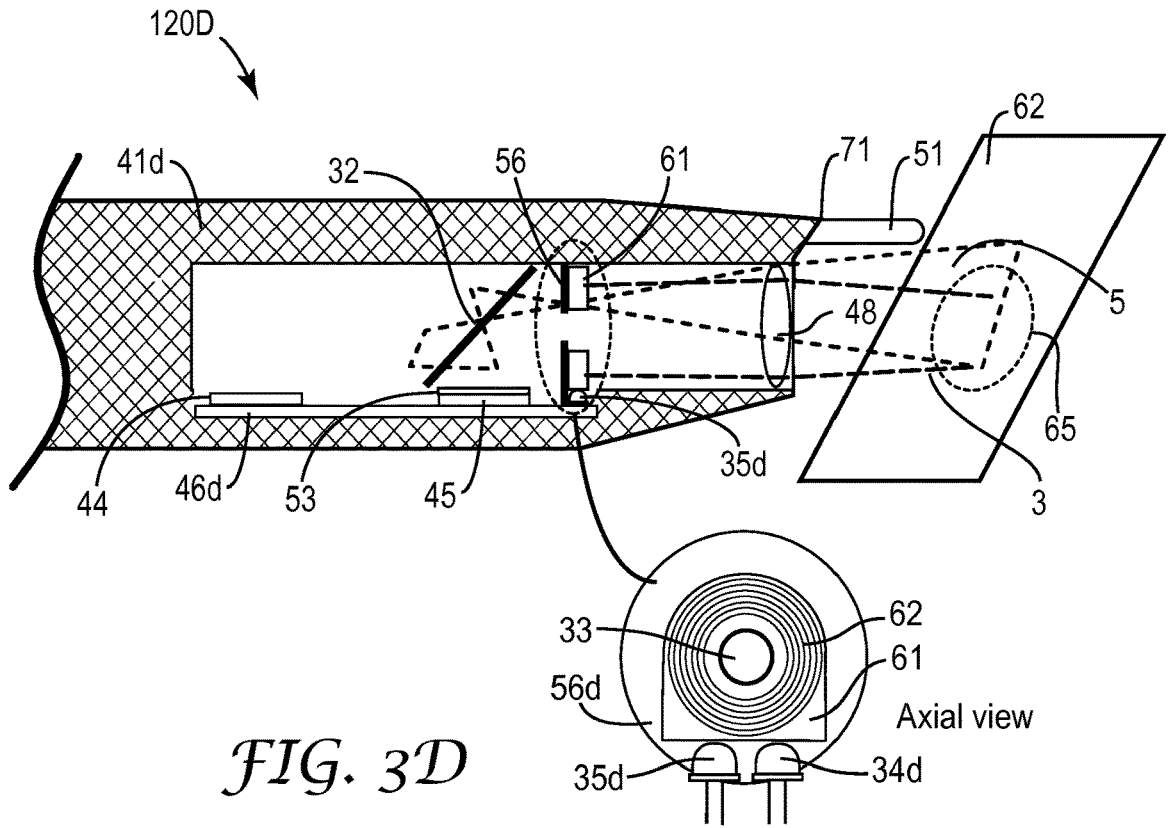
FIG. 3d shows a cross section of the end portion of dual-source stylus with a coaxial optical path, dichroic mirror, and two image sensors.

FIG. 3d shows a simplified cross sectional view of a portion of stylus 120D that is similar to stylus 120C, but forward-facing light sources 34c and 35c are replaced by lateral-facing light sources with a light guide 61 that turns light 3 or light 6 by 90 degrees and focuses it toward objective lens 48d. Light guide 61 may be coated with reflective material on its rear surface and on edges, with the exception of the edge where light from sources 34d and 35d enter light guide 61. Fresnel lens facets 62 on light guide 61 may be used to focus light 3 and light 6 to uniformly illuminate the field of view 65. Light 5 enters the end of stylus 120D through lens 48d and is focused through aperture 33, then reflected on mirror 32d. From mirror 32d, light 5 passes to color filter 53d and to image sensor 45d.

Figure 2A:
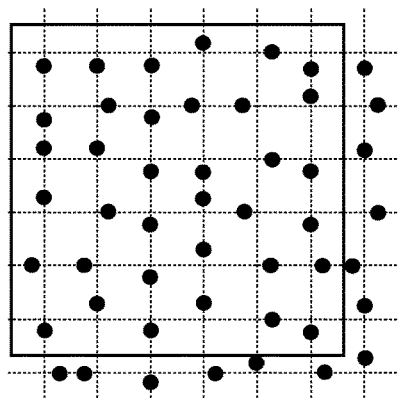
FIG. 2a shows a magnified drawing of a prior art position-unique indicia pattern.
Figure 3E:
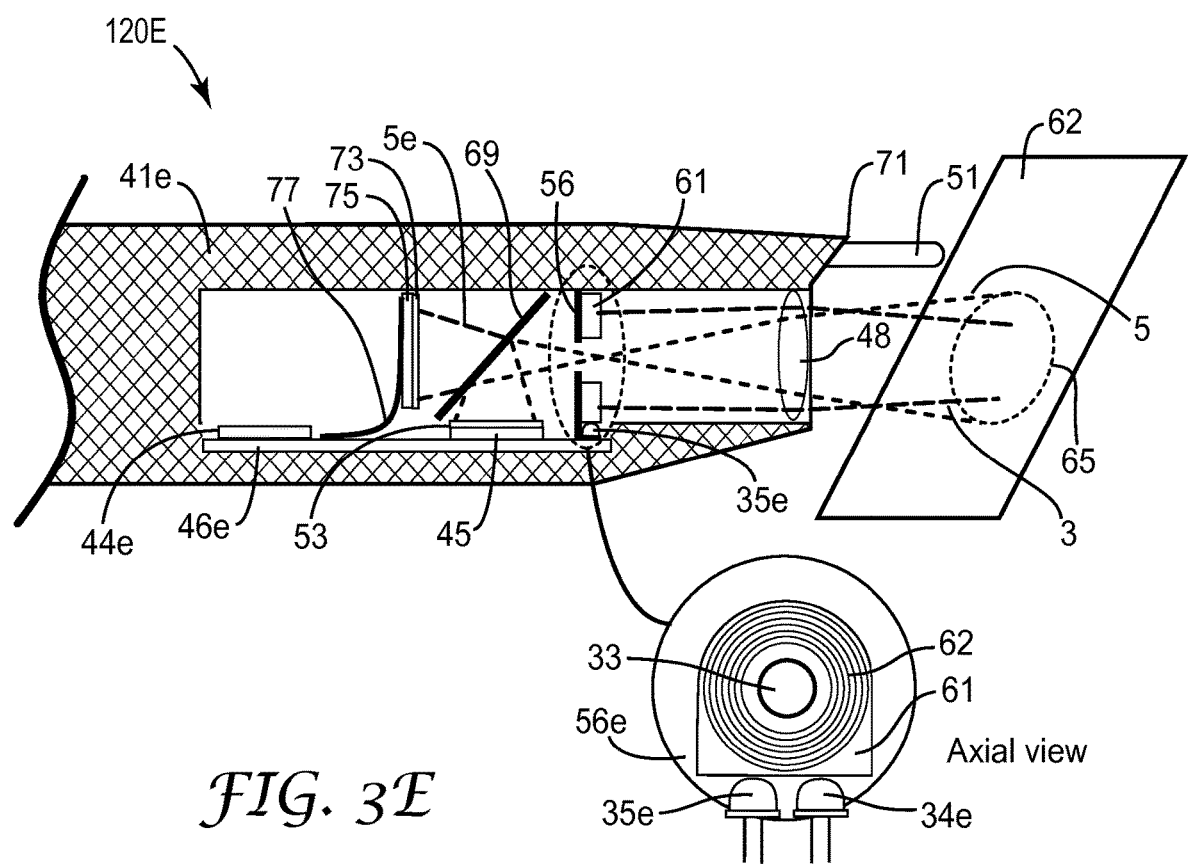
FIG. 3e shows a cross section of the end portion of a stylus similar the one shown in FIG. 3D, with two image sensors having filters.

FIG. 3e shows a simplified cross sectional view of a portion of stylus 120E that is similar to stylus 120D, but the single image sensor 45d is replaced by two image sensors 45e and 75, having filters 53e and 73, respectively. Light 5 enters the end of stylus 120E through lens 48e and is focused through aperture 33 in aperture plate 56d. Light in the IR wavelength range is then reflected on dichroic mirror 69 to filter 53e and image sensor 45e. Filter 53e may separate IR light into different wavelength ranges so image sensor 45e can discriminate one wavelength range from another, or image sensor 45e may detect a monochrome image including a single range of IR wavelengths. Light 5e in the visible wavelength range passes through dichroic mirror 69 and visible light filter 73 to image sensor 75. Filter 73 may separate visible light into different wavelength ranges so image sensor 75 can discriminate one wavelength range from another, or image sensor 75 may detect a monochrome image including the full range of visible wavelengths. Flexprint 77 connects image sensor 75 to PCB 46c. Processor 44e uses image information from image detector 45e and 75 to resolve images that may include images in an IR wavelength range and/or images in a visible wavelength range. Dichroic mirror 69 may comprise the same material used for dichroic substrate 148, described with respect to FIG. 4b, separate image sensors may have advantages including higher potential special resolution, and availability of specific ICs that lack a color filter, but have advantages such as low cost and high imaging frame rate. FIG. 2a shows an Anoto type indicium within the solid rectangle, comprising a pattern of opaque dots on a substrate, arranged on a virtual 6×6 matrix indicated by dotted lines. Each intersection of the matrix has one dot, and each dot is position-encoded into one of four positions above, below, left, or right of the intersection. This provides a coding system based on thirty-six digits of base four, so each 4-some combination of the indicia can represent as many as $4^{36}$ unique codes. Permutations of codes are reduced to allow independent encoding of X and Y coordinates in each indicium. Permutations are also reduced by the requirement for redundancy that allows determination of the position of a partial surface, and to detect code sequences from any orientation. Even with such reductions, Anoto indicia can encode extremely large areas with position-unique indicia less than 2 mm in size, where each of the indicia uniquely defines a local region of a substrate.

Photoluminescent indicia described herein may use the same pattern of monochrome dots as used by Anoto, or other options may be preferable. For example, visible light transmissive photoluminescent materials may be used to make features of larger size that still have minimal optical visibility. Larger dots or other feature shapes may be easier to print, and material with larger photoluminescent particles may be used, while indicia size is maintained at less than 2 mm square.

Figure 2B:
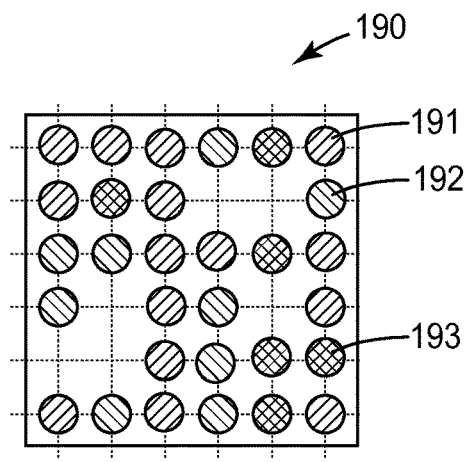
FIG. 2b shows a magnified drawing of a 6×6 position-unique indicia pattern with a plurality of wavelength combinations.

Indicia features emitting distinguishable wavelengths of light provide additional coding alternatives. The base four coding system described above can be achieved with four wavelength combinations instead of four-quadrant dot placements or four symbol shapes. An example is shown in FIG. 2b, where dots comprising photoluminescent nanoparticles with different emission wavelength ranges are used to uniquely define an indicium 190, which together with other indicium may be used to uniquely define local areas of a substrate. A first indicia wavelength range may be centered on 850 nM and a second indicia wavelength range may be centered on 950 nM. Indicia may comprise dots, or other shapes, positioned in any of thirty-six positions. Each possible dot position has one of four features: a dot of the first indicia wavelength range 191, a dot of the second indicia wavelength range 192, a dot with indicia wavelengths from the first and second ranges 193, or no dot. Other wavelength combinations, and other feature shapes or combinations of feature shapes may be used. For example, a four-position encoded pattern of dots may also have dots of two wavelength ranges, so each position in a 5×5 indicium has eight possible codes, resulting in more than $4^{36}$ unique codes in a 5×5 matrix.

Figure 2C:
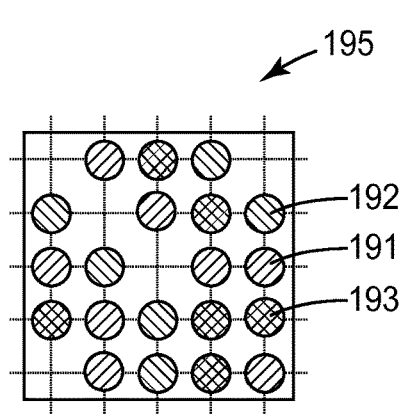
FIG. 2c shows a magnified drawing of a 5×5 position-unique indicia pattern with a plurality of wavelength combinations.

FIG. 2c shows an indicium 195 comprising a 5×5 array that comprise dots that luminesce in a plurality of wavelength combinations, the wavelength combinations uniquely defining local regions of the substrate. The 25 possible positions in the array have dots having one of four features: a dot of the first indicia wavelength range 191, a dot of the second indicia wavelength range 192, a dot with indicia wavelengths from the first and second ranges 193, or no dot. The pattern is restricted to no dots at three corners, as shown; all other positions of the top, right, and bottom edges have dots that emit in at least one wavelength. This pattern provides easy recognition of indicia borders and angular orientation. Given feature-to-feature spacing of 0.3 mm, a repeating pattern of unique indicia can provide pattern and wavelength combinations uniquely defining local regions of a substrate area nearly 500,000 square meters.

Figure 2D:
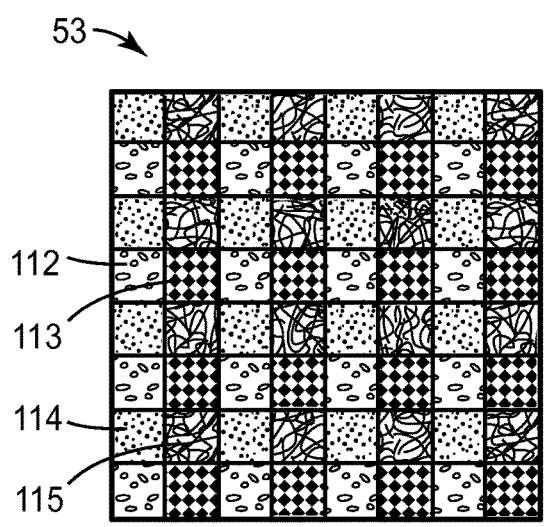
FIG. 2d shows a filter that could be used conjunction with a position-unique indicia pattern with a plurality of wavelength combinations.

FIG. 2d shows details of a portion of exemplary color filter 53 that is configured as an array of filter cells, using known color filter methods. Most color filters have arrays of cells that pass red, green, or blue light to pixels an image sensor. For example many color filters use a Bayer filter (U.S. Pat. No. 3,971,065) that has twice as many green filter cells as red or blue, often in a pattern of R,G,G,B or R,G,B,G. Filter 53 replaces one or more of the R,G,B filter cells with cells that pass light in the IR wavelength range. Filter 53 can pass up to four wavelength ranges to selected pixels of an image sensor, so the image sensor can discriminate among image features having different wavelength ranges, or colors. In one embodiment, filter 53 passes two wavelength ranges of visible light and two wavelength ranges of IR light to image sensor 45, with coupled electronics that resolves a location based on signals from the image sensor. Such a filter, or one like it, may be advantageously used in conjunction with resolving indicia such as indicium 190 and 195.

In one embodiment described with respect to FIG. 2b and FIG. 2c, four color filter cells in filter 53 comprise cells 112 and 113 that pass IR light centered on 850 nM and 950 nM respectively. And visible light cells 114 and 115 that pass light centered on wavelengths 500 nM and 600 nM respectively. IR cells 112 and 113 preferably pass light with a bandwidth of +/−50 nM. Visible cells 114 and 115 preferably pass light with a bandwidth of +/−100 nM. Other color filter layouts may be used, and other filter wavelength combinations may be used. In some embodiments, it may be sufficient to detect monochrome visible images, so filters 114 and 115 may both detect visible light from 450 nM to 700 nM, for example. In some embodiments, visible image detection may not be required, so all cells of filter 53 may pass one or more IR wavelength ranges.

Table 1 summarizes the operating modes of stylus 120. Modes will be described with respect to components of stylus 120C, although the modes apply to the other exemplary stylus configurations herein. Table 1 shows examples of components used in various combinations to read images from various media.

Stylus Mode 1—Photoluminescent Media

To read photoluminescent indicia, light source 35 is turned on and source 34 is off. The indicia image may be filtered through an IR-transparent color filter. For example, filter 43 or cells of a color separating filter such as cells 112 and/or 113 in filter 53. The image is read from image sensor 45 by processor 44.

Stylus Mode 2—Passive Media

To read light absorbing passive indicia on a light diffusing or reflective substrate such as paper, source 34 is turned on and source 35 is off, so light 3 emitted from stylus 120 is at a wavelength that will pass through stylus filters 43 or 53 to stylus image detector 45. Light 5 reflected from indicia having an image formed by contrast between indicia features and the substrate, is received and filtered through IR-transparent color filter 43 or IR-transparent cells in filter 53, and the IR image is read from image sensor 45 by processor 44.

Passive indicia on a light transparent substrate may absorb light, or they may diffuse or reflect it. To read light from such media, source 34 is turned on and source 35 off, so light 3 emitted from stylus 120 is at a wavelength that will pass through stylus filters 43 or 53 to stylus image detector 45. The illuminated indicia image light 5 is received and filtered, and the IR image is read from image sensor 45 by processor 44. The image received from passive indicia on a transparent substrate may be a reverse image relative to passive media on an opaque substrate, depending on whether the indicia or the background reflect light 5 toward stylus 120.

Stylus Mode 3—Visible Emitting Display

To read a light emitting visible image, (for example, indicia displayed on an LCD or OLED), source 35 and source 34 may be turned off. A displayed cursor may be used as a location-specific indicium, or pixels on a display may be tracked to detect movement as described in U.S. Pat. No. 7,646,377. In addition, the IR-measuring pixels of image sensor 45 may be read, to detect any time-varying IR signals that may be emitted from the display. Time-varying IR signals may be encoded to indicate which of several displays are in the field of view of stylus 120, as described in U.S. patent application Ser. No. 13/454,066, which is hereby incorporated by reference in its entirety.

TABLE 1

| | Stylus Component | | | |
|---|---|---|---|---|
| Image Mode being read | source 35 (excitation light) | source 34 (IR light) | Image sensor IR pixels | Image sensor visible pixels |
| 1 Photoluminescent Indicia | On | Off | Read image | |
| 2 Passive Indicia (reflective) | Off | On | Read image | |
| 3 Visible emitting display | Off | Off | | Read image |

In one embodiment, multi-mode stylus 120 can operate in various modes as listed in Table 1. Manual switching of modes may be done with switches on the stylus or by interaction with an application and GUI on a display. Automatic switching among modes may also be supported, based on input received by stylus 120. For example, given stylus 120 with filter 53 and image sensor 45 that can sense images in multiple wavelength ranges, and two illumination sources 34 and 35 of different wavelengths, images under different combinations of source illumination may be tested sequentially until a valid image is recognized. The following exemplary algorithm may be used to automatically switch stylus sensing modes:

1. Stylus Mode 3 is activated, whereby sources 35 and 34 are turned off, then visible images are detected.
   1.1. Detected images are processed to recognize any supported indicia in the stylus FOV. If no supported indicium is detected, go to step 2, otherwise,
   1.2. Any detected visible image is correlated with supported indicia or stylus-locator cursors, for example as, for example, described in U.S. Pat. No. 7,646,377.
      1.2.1. If matched, a display-referenced location is calculated and reported.
         1.2.1.1. Repeat from Step 1.1
      1.2.2. If unmatched, report no stylus-related visible image is in the FOV.
2. Stylus Mode 1 is activated, whereby source 35 is turned on and source 34 is turned off, then IR images are detected.
   2.1. Any detected IR image is correlated with supported indicia patterns. If a positive correlation is determined, a luminescent digitizer location is calculated and reported.
      2.1.1. Repeat Step 2 until no IR image is detected, then go to Step 1
3. Stylus Mode 2 is activated, whereby source 35 is turned off and source 34 is turned on, then IR images are detected.
   3.1. Any detected IR image is correlated with supported indicia patterns. If a positive correlation is determined, a passive digitizer location is calculated and reported.
      3.1.1. Repeat Step 3 until no IR image is detected, then Go to Step 1.

Figure 4A:
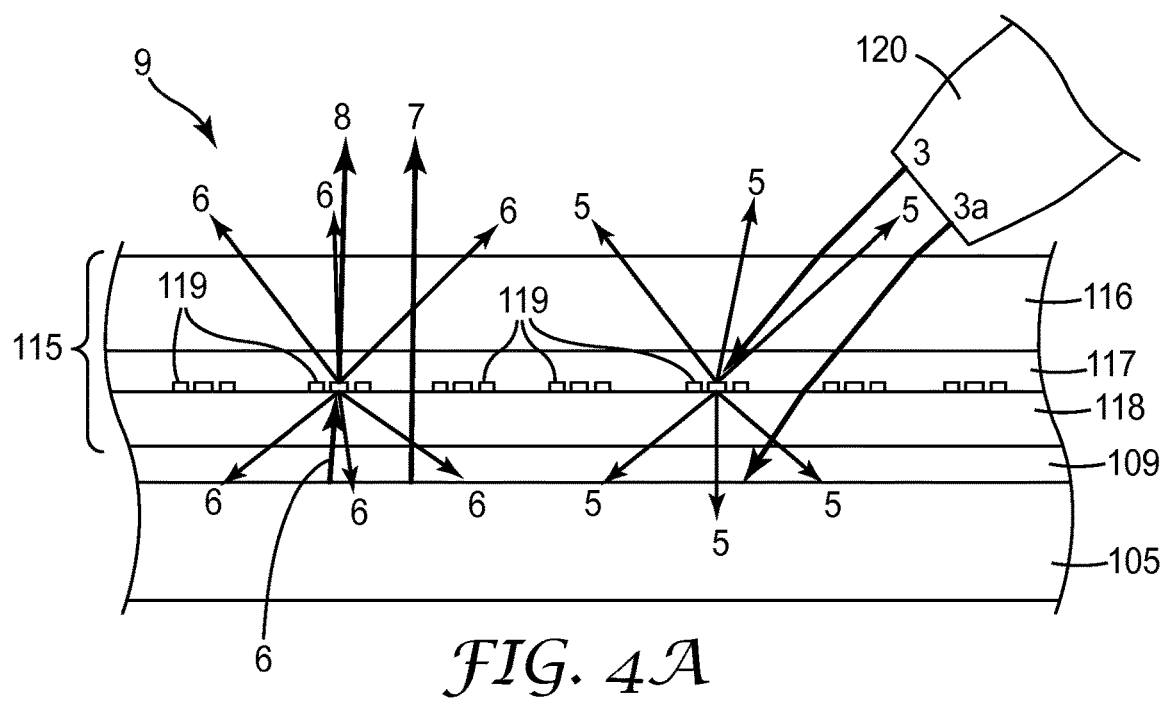
FIG. 4a shows a magnified cross section view of a portion of a digitizer and display system.

Referring now to FIG. 4A, photoluminescent indicia 119 are deposited on the surface of visible light transmissive substrate 118. Indicia may be deposited by printing a thin layer of photoluminescent material. For example photoluminescent quantum dots may be mixed with a printable medium, and printed using known methods. Indicia-printed substrate 118 is then laminated to durable overlay 116, which may be glass, acrylic, or any suitable transparent working surface that will protect the indicia. Alternatively, indicia may be printed on the bottom surface of overlay 116.

Adhesive 117 that binds substrate 118 to overlay 116 may be an optically clear adhesive (OCA) such as those sold be 3M Co. of St Paul, Minn., USA. Adhesive 117 may be replaced by an air gap, (providing indicia 119 have an environmentally protective coating) and air gap 109 may also be replaced with an OCA.

Illumination from stylus 120 comprises excitation light 3 and 3a which have a first wavelength range (for example, near UV-A or near IR). Light 3a that does not get absorbed by indicia 119 passes through substrate 118, and is absorbed or reflected by layers below. Some of light 3 is absorbed by indicia 119 which excites indicia 119 such to radiate indicia emitted light 5 in various directions, including into the stylus housing which includes optical sensing electronics, as described earlier. Indicia emitted light 5, in this embodiment, is primarily in a second wavelength range, in this case it is within the IR range. Visible display light 7 and 8 is emitted from display 105. Some display light 8 that hits indicia 119 will pass through the indicia. Some of the display light 2 may also be absorbed by the indicia 119 and will excite the indicia causing it to luminesce, resulting in light 6. Ambient light 9 may also cause photoluminescence in indicia 119, resulting in indicia emitted light 6.

Display 105 is shown as a planar cross section, but display 5 may include other shapes. For example, the display may comprise a rear projector and a rear projection panel.

Figure 4B:
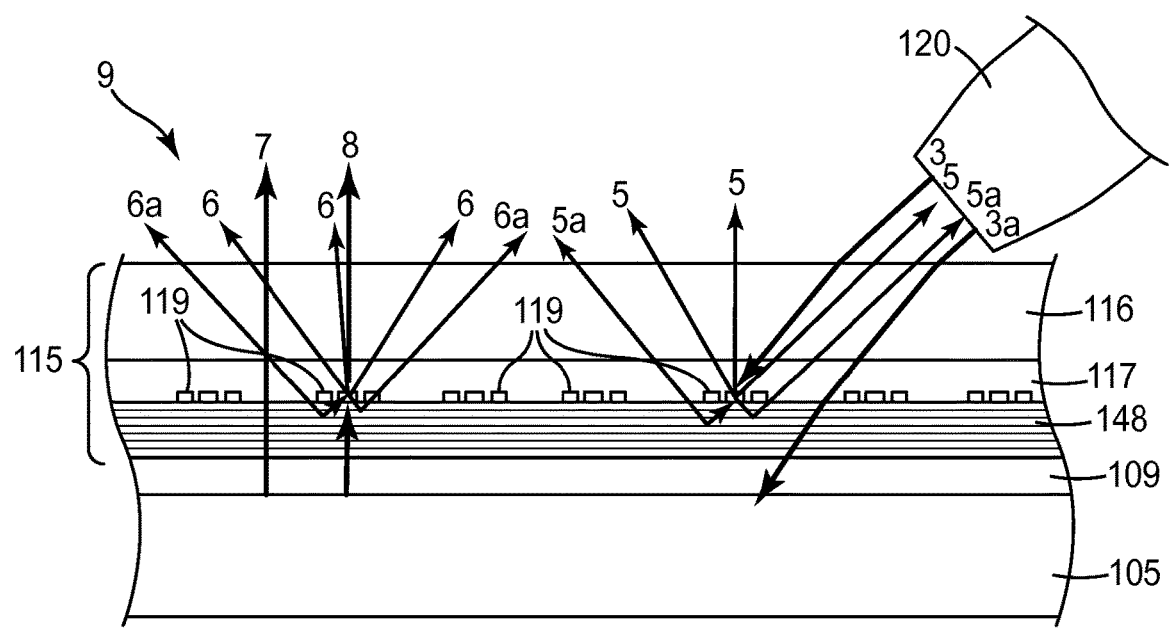
FIG. 4b shows a magnified cross section view of a portion of a digitizer and display system with a dichroic reflector.

FIG. 4B shows a digitizer system identical to that in FIG. 4a, except substrate 118 is replaced by dichroic substrate 148 that passes light of some the first wavelength range while reflecting light of the second wavelength range, where wavelengths of the first range are typically shorter than wavelengths of the second. For example, substrate 148 may be visibly transparent IR reflective material such as 3M Company's multilayer optical films (MOF) which are available commercially under the names Crystalline automotive films and Prestige Series residential window films. Dichroic reflective substrate 148 increases the efficiency of the system by re-directing indicia-generated light of the second wavelength range that would not otherwise have reached stylus 120. 3M Company's PR90EX film may be used for the reflective substrate 148.

Figure 4C:
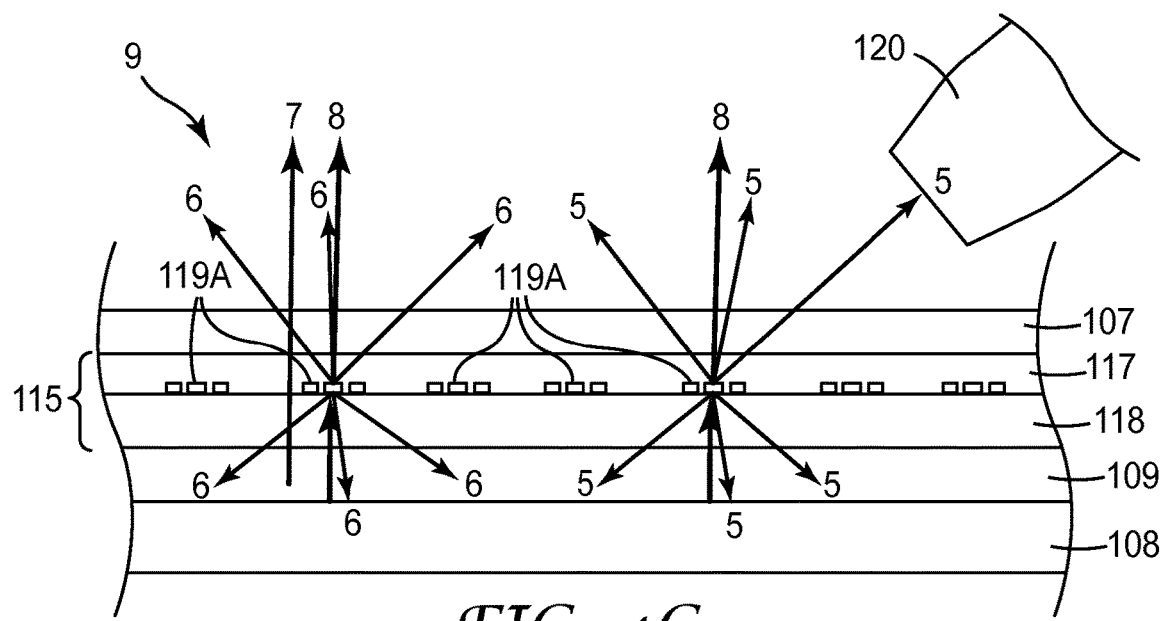
FIG. 4c shows a magnified cross section view of a portion of a digitizer and display system.

FIG. 4C shows a magnified cross section view of a portion of digitizer and display system 102 (see FIG. 1c). In this embodiment, indicia are excited by light radiation provided by backlight 108. In other embodiments, however, the stylus could additionally include such a further illumination source.

If display 107 is a light emitting display such as a (transparent) OLED, backlight 108 may not be required.

Where optional backlight 108 is used (for example, in combination with an LCD display), visible (white) display light 7 and 8 may be emitted from optional display backlight 108. A portion of light 7 that is not absorbed by Indicia 119A passes through substrate 118, optically clear adhesive layer 117, and through pixels of display 107, to form a displayed image. Light from backlight 108, may comprise wavelengths outside the visible spectrum. For example, near infrared (IR) light (700 nm-1000 nm) or near UV light (e.g. 350 nm-400 nm) may be emitted from the backlight to energize indicia on substrate 118. Some of these wavelengths may be filtered out by layers above the indicia, (for example, the color filter of display 107, which would be typical if 107 were an LCD), so minimal amounts of these wavelengths of light may reach the user. An LCD display comprising quantum dots energized by a backlight is described in US Patent Application No. 2008/0246388, "Infrared Display with Luminescent Quantum Dots."

Figure 4D:
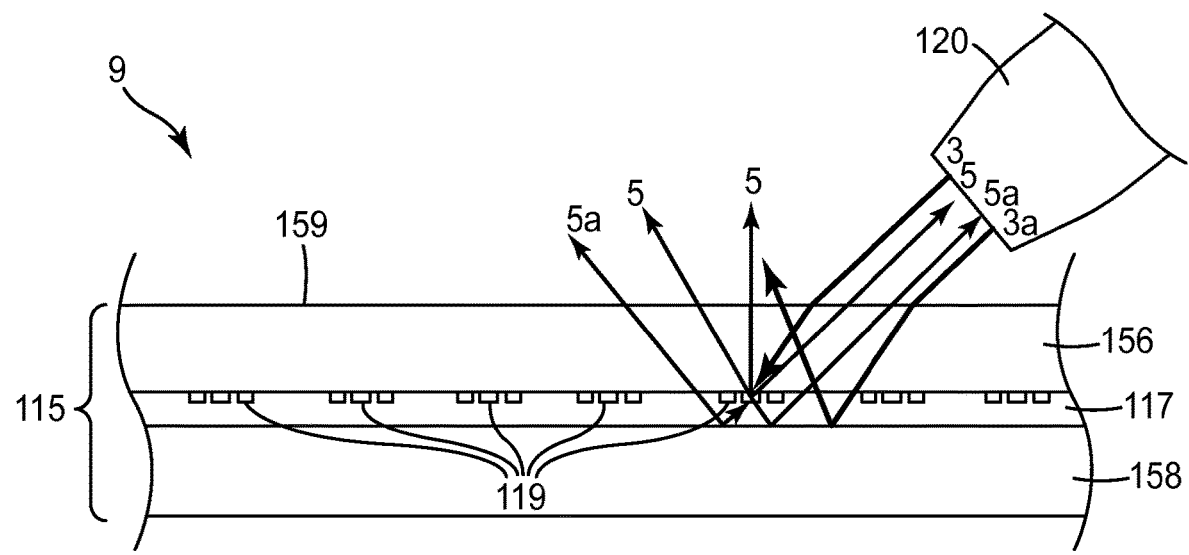
FIG. 4d shows a magnified cross section view of a portion of a digitizer and display system.

FIG. 4D shows a magnified cross section view of a portion of digitizer and display system 103 (see FIG. 1d). The stylus, in this embodiment, is similar to that described with respect to FIG. 4b, in that it includes an illumination source that excites the indicia. This embodiment shows the use of photoluminescent position-unique indicia in a whiteboard-type environment. A transparent overlay including photoluminescent indicia 119 and optically clear adhesive layer 117, as well as substrate 156 (here, substantially light transmissive such that graphics on the surface of substrate 158 are visible through the stack comprising substrate 156 and OCA 117). Surface 159 of substrate 156 may be layered with a material, such as Tedlar® (available from DuPont), polypropylene, or other surface compatible with whiteboard applications, or it could be an anti-scratch, anti-reflective, anti-glare, polarizing, or color filtering layer. Substrate 156 may comprise a plurality of layers. In such embodiment, stylus 120 may include inks compatible with whiteboard applications, such that a user may write on the whiteboard while electronics in the stylus computes coordinates of the writing and provides these to a computer.

Figure 4E:
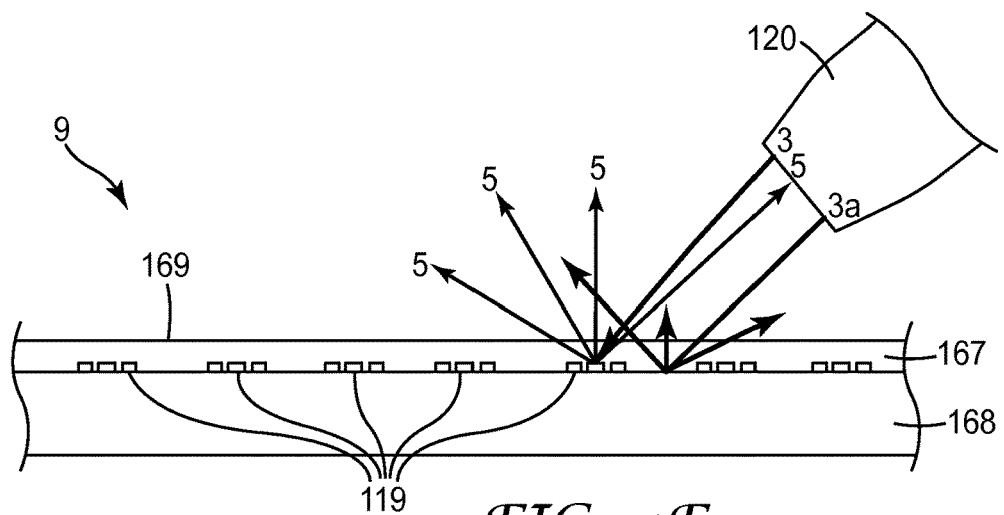
FIG. 4e shows a magnified cross section view of a portion of a digitizer and display system with a minimal overlay.

FIG. 4E shows the use of photoluminescent indicia on an opaque or translucent substrate. Photoluminescent indicia 119 are deposited on the top surface of substrate 168, which may be paper, cardboard, PET, PEN, glass, acrylic, or any material that supports indicia 119. Indicia 119 are deposited by printing a thin layer of photoluminescent material. For example photoluminescent quantum dots may be mixed with a printable medium, and printed using known methods. Indicia-printed substrate 168 may then be covered with optional layer 167 that is transparent to stylus excitation light 3 and indicia emitted light 5. Layer 167 may optionally be added to protect indicia. Layer 167 may be an anti-scratch layer, a durable layer comprising a polymer hardcoat, or a polymer hardcoat filled with silica particles, or a sheet of material such as PET may be laminated to substrate 168. Surface 169 may have anti-reflective (AR), and/or anti-glare (AG) properties. Additionally, substrate 168 may be printed with a visible static image. While the pen showed in FIG. 4e includes an illumination source to excite indicia within the stylus FOV, depending on the application, the stylus could sense indicia excited by other means, such as ambient light 9. In such case, the stylus would not necessarily need an illumination source.

Figure 4F:
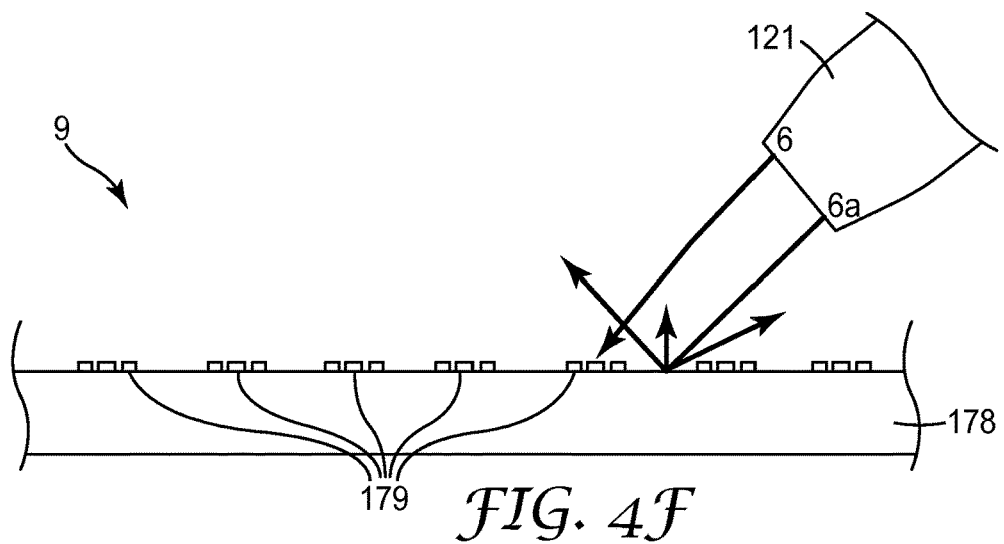
FIG. 4f shows a magnified cross section view of a portion of a digitizer and display system with stylus operating in reflective mode.

FIG. 4F shows a somewhat different embodiment, where stylus 120 senses passive indicia that operate in a light absorbing or light reflecting mode, for example, as indicated in Table 1, Mode 2. In this embodiment, stylus 120 provides an illumination source (for example, light source 34 in FIG. 3c) that is reflected by substrate 178, but not reflected by, or minimally reflected by the features of indicia 179, for example the dots exemplified in FIG. 2a. Indicia 179 preferably comprise a thin layer of IR-absorbing material; substrate 178 is preferably an IR-reflecting or IR transparent material; and the image sensor in stylus 120 senses the reflected light that has the same wavelength as the illumination source. An image is formed by contrast between reflected light and indicia-absorbed light. Thus this embodiment provides a "negative" image of the indicia, which may be desirable in some embodiments, for example to detect black (IR absorbing) indicia features printed on white paper. Alternatively, indicia features may reflect light of the illumination source 34 and the substrate may absorb stylus illumination, resulting in a "positive" image of indicia-emitted light on a dark background being detected by image sensor 45.

Figure 4G:
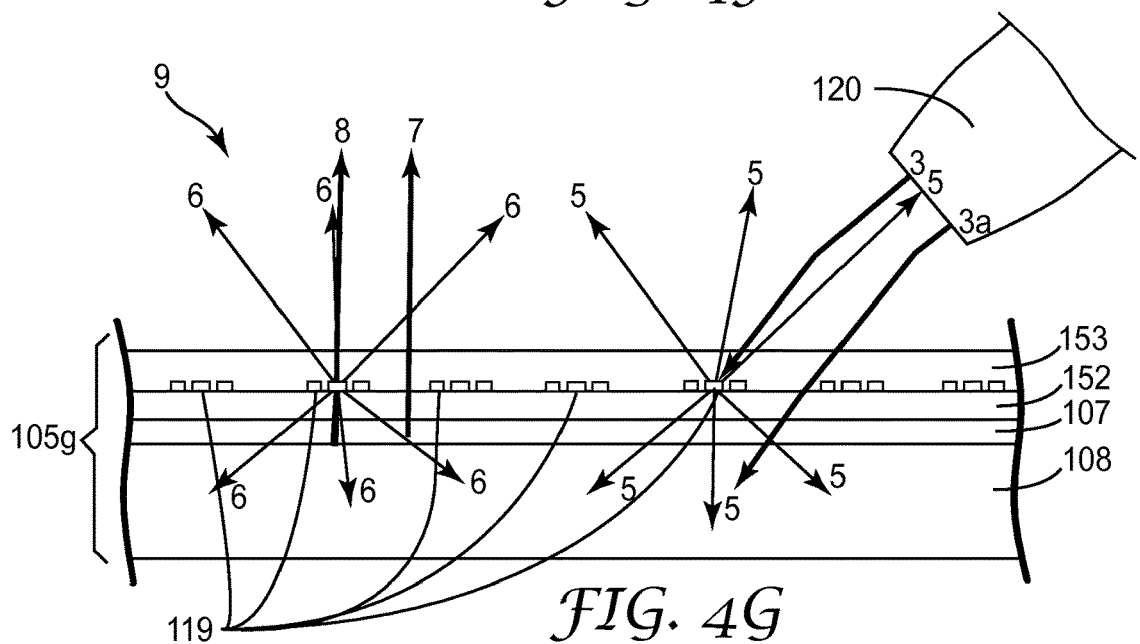
FIG. 4g shows a magnified cross section view of a portion of a digitizer and display system with indicia printed on the color filter of a display.

FIG. 4G shows a magnified cross section view of a portion of digitizer and display system similar to system 100 (see FIG. 1A), except the substrate portion of digitizer 115 is eliminated and indicia 119 are printed onto color filter 152 of LCD 105g. Indicia 119 are in one embodiment optically transparent, and the features of indicia 119 (for example the indicia dot patterns similar to 190 or 195) may be aligned with the color cells of color filter 152. As an alternative construction, indicia 119 may be printed onto the bottom surface of top polarizer layer 153. Integration into an LCD offers the advantage of thinner construction and potential for better visible light transmission through LCD 105g.

Electronically addressable display 105g (e.g., an LED, plasma, etc.) has display coordinates that uniquely identify the location of each pixel. Similarly, digitizer 115 (FIG. 4A-4D) includes a digitizer coordinate system wherein each location on the surface is identified by location-unique indicia 119. Given the display is co-planar with a digitizer, digitizer coordinates can be aligned with display coordinates of such systems using a calibration process that associates each display pixel at a particular localized area with one or more of digitizer indicia 119 associated with that same localized area. After calibration, indicia 119 can be used to indirectly reference display pixel coordinates and vice versa.

Calibration may be performed at a manufacturing site, or by the end user of a device. In some "after market" embodiments, a user may assemble the digitizer 115 onto a display 105. In such case, it will generally be necessary for the user to perform calibration. The calibration system described below allows a user of minimal skill to perform an accurate calibration. Two alternative calibration methods are described below.

Figure 6:
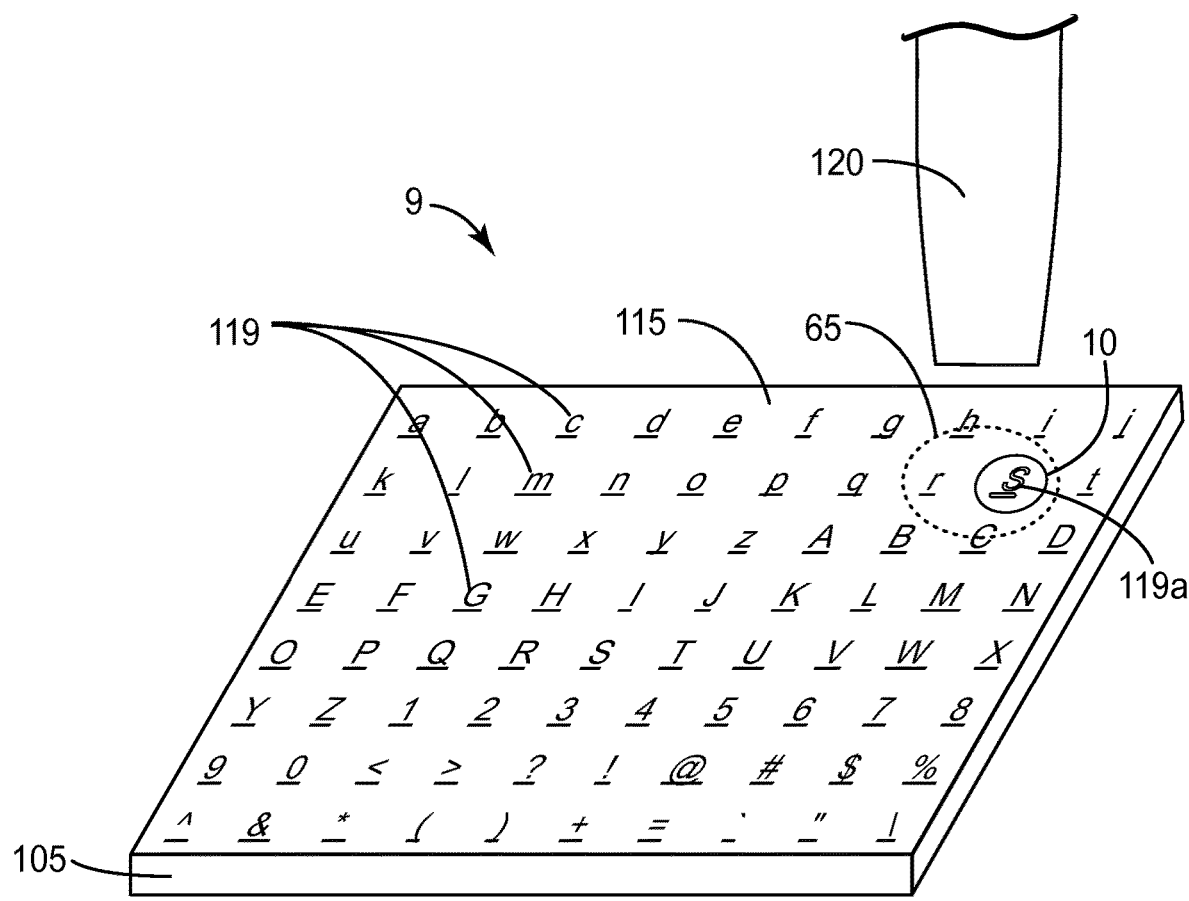
FIG. 6 shows an indicia-printed overlay on a display with a calibration indicium illuminated on the display.

FIG. 6 shows a view of display 105 and surface 115 with indicia 119, which are in this drawing represented by position-unique number and letter symbols (used herein only for illustration purposes). In practical systems, indicia will typically comprise position-unique dot or line patterns, for example those described with respect to FIG. 2. Each of the indicia 119 are located at known digitizer coordinates on surface 115. The X,Y coordinates of indicia 119 are designated as $iX_n$, $iY_m$. Coordinates of pixels on display 105 are designated as $dX_n$, $dY_m$.

A first calibration embodiment is described with respect to FIG. 6. In a calibration mode, display 105 radiates a calibration indicium 10 at a first localized area with a first indicia wavelength range that comprises visible light. In the example described with respect to FIG. 6, indicium 10 is a round spot that serves as an indicium for stylus 120 and may also serve as a user-visible cursor. Stylus 120, or generically a sensor device or a sensing unit, is placed so calibration indicium 10 is in its field-of-view (FOV) 65. Placement of the stylus may be done by a user aiming stylus 120 at visible indicium 10. Stylus 120 senses indicium 10, and stylus 120 also illuminates its FOV with light of a first illumination wavelength range and senses whatever photoluminescent indicia are also present with its FOV, which radiate light within a second indicium wavelength range. In other words, the photoluminescent indicia being sensed are also associated with a common first localized area. In some embodiments, the second wavelength range is not the same as the first. One or more digitizer indicia within the FOV will happen to be co-located with display indicium 10. The digitizer will determine and note the coordinates of such co-located indicia. The co-located indicia are then associated with the display coordinates of the calibration indicium. These coordinates are stored and used to relate subsequent digitizer measurements to display coordinates. For example, in the example shown in FIG. 6, indicia r and s are in the FOV of stylus 120 but only s is co-located with indicium 10 so s is associated with the address of pixels forming indicium 10. Calibration may continue with indicium 10 placed at a second predetermined location, and the above-described calibration procedure repeated.

A second embodiment of the calibration process is also described with respect to FIG. 6. In this embodiment stylus 120 does not sense radiation in the first indicium wavelength range emitted by indicium 10, but only senses indicia-radiated light in a second indicia wavelength range that is emitted from digitizer indicia 119. Indicia 119a, upon exposure to excitation radiation, luminesce in a second indicia wavelength range in response to light energy from indicium 10.

Display 105 activates indicium 10 having light in a first indicia wavelength range that may comprise visible light. Stylus 120 is placed so calibration indicium 10 is in its FOV 65. Light from pattern 10 illuminates indicia 119a, which is co-located with (i.e., in this case directly above) indicium 10, and causes them to radiate indicia emitted light (luminescence) in a second indicia wavelength range that is different from the first wavelength range of indicium 10. Stylus 120 senses indicia 119a in its FOV. Ambient light 9 is preferably limited to prevent ambient light 9 from being a source of excitation radiation to indicia 119 that are not illuminated by light from indicium 10.

Display 105 is, in this second calibration embodiment, emitting no light except for the displayed indicium 10 that is centered at display coordinates $dX_{10}$, $dY_{10}$. (which correspond to the center of indicium 10. Most of photoluminescent indicia 119 are dark because they have no excitation energy, with the exception that indicium 10 is illuminating indicia 119a, causing it to luminesce. Stylus 120 with indicium 10 in its FOV senses indicia 119a at digitizer coordinates $iX_{10}$, $iY_{10}$. Thus the display coordinates $dX_{10}$, $dY_{10}$. are determined to be co-located with indicia coordinates $iX_{10}$, $iY_{10}$. Light sources 34 and 35 in stylus 120 are turned off during this procedure of embodiment 2. Display 105 may emit light in a time-modulated sequence and the stylus may demodulate the resulting time-modulated signal re-radiated from indicia 119a.

If display 105 has higher resolution than indicia 119, the location of indicium 10 may be adjusted in size until it minimally circumscribes a single indicium. This may increase the accuracy of aligning indicium 10 with digitizer indicium 119a. Indicium 10 may also be incrementally adjusted in the X and/or Y direction as the illumination level of the excited indicium 119a is measured, to determine the exact location of the indicia relative to display 105.

The procedures described in both the first and second calibration embodiments have a benefit that the calibration pattern must be in the stylus FOV, but it need not be in the center of the stylus FOV, so inaccurate placement of the stylus has minimal effect on calibration accuracy. Identification of orientation (for example the rotation) of indicia relative to a stylus may also provide information about the orientation of the stylus relative to a digitizer and a display.

Using either calibration method described above, calibration data is computed by way of a processor, and such calibration data may then be outputted to another computing device which may store such calibration data for future reference. For example, a computer may store the calibration data so the calibration routine need not be repeated each time the computer boots.

Stylus 120 may have an extendable tip 51 that makes contact with a digitizer surface. In Mode 2, the stylus is used with passive indicia, which may include indicia printed on paper. Where writing on paper may be preferable, an extendable/retractable inking tip 51 may be extended. In other modes, inking may not be desirable and a different (e.g. non-scratching) tip material such as Delryn plastic may be preferred. Stylus may have a plastic tip 71 that extends beyond lens 48, and an ink-dispensing tip 51 that can be adjusted to extend beyond plastic tip 71, or to retract so plastic tip 71 is the outermost point beyond lens 48.

Figure 5A:
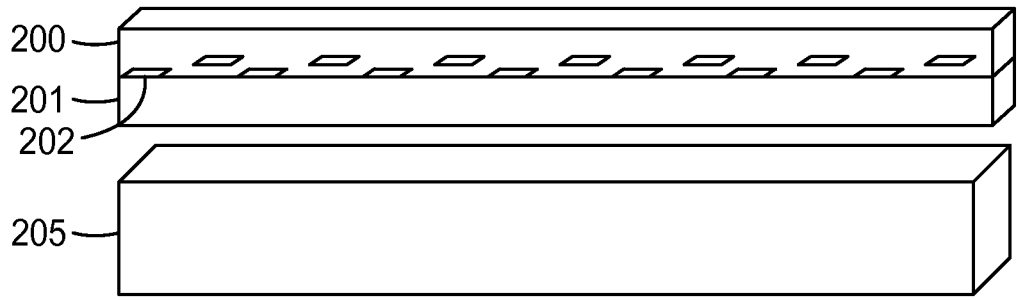
FIG. 5a shows an exemplary product construction.

The digitizer panel can be integrated into a display stack-up in a variety of ways using a variety of rigid or flexible materials. One embodiment shown in FIG. 5a comprises an overlay where the digitizer panel is attached to a device 205, in an after-market application using self-wetting adhesive 201. This panel is constructed by forming the photoluminescent indicia 202, on one side of substrate 200 (in this case PET), and covering these indicia with said adhesive 201. To attach the panel, the user may place the adhesive-side of the panel onto the device 205. To improve the durability of the overlay, a hard-coat may be added to the side of the panel that faces the user.

Figure 5B:
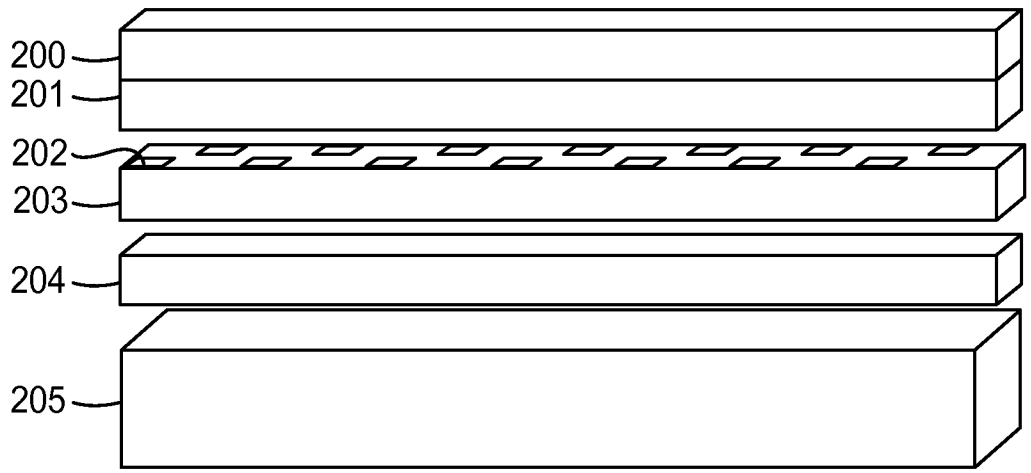
FIG. 5b shows an exemplary product construction.

Another embodiment shown in FIG. 5b for an overlay in aftermarket applications may be constructed by first printing the indicia 202 on multilayer optical film (MOF) 203, which reflects IR. In this construction, the device-facing adhesive 204 may be placed on the opposite side as the indicia since the emitted signals from the photoluminescent dyes do not pass through MOF 203. To further protect the indicia from the user's interaction, a protective layer 200, such as PET, may be adhered to the top of the MOF to cover the indicia, using adhesive 201.

Figure 5C:
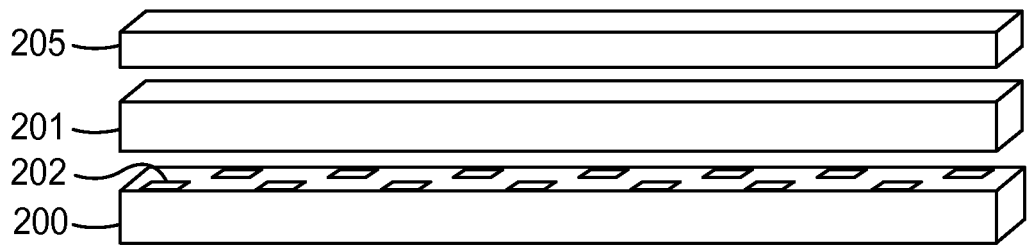
FIG. 5c shows an exemplary product construction.
Figure 5D:
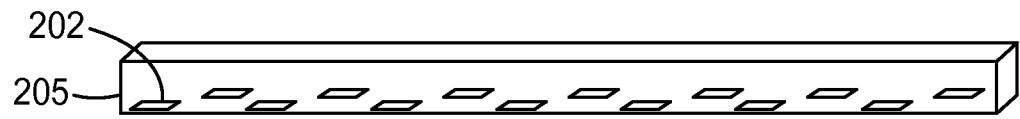
FIG. 5d shows an exemplary product construction.

Another embodiment is an underlay where the digitizer panel is attached to a touch-sensitive screen including but not limited to those product offerings from 3M Touch Systems, as a surface-capacitive technology (SCT) screen or a projected-capacitive technology (PCT) screen. FIG. 5c shows such an embodiment, where the photoluminescent indicia 202, formed on a transparent substrate 200, such as PET or MOF, covered with an optically-clear adhesive, 201. This adhesive may then be attached to the back of the touch sensitive screen 205, using a variety of methods known in the art. Another embodiment as shown in FIG. 5d is to print the photoluminescent indicia 202 directly onto the touch sensitive screen 205, either at the beginning, middle, or end of an already established process.

Figure 5E:
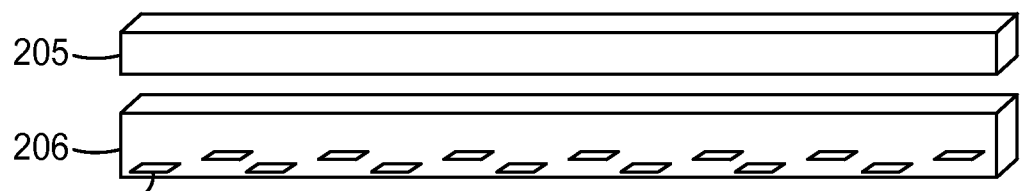
FIG. 5e shows an exemplary product construction.

Another embodiment shown in FIG. 5e is specific to a layered touch sensor, such as a PCT screen, as an underlay solution. In such an embodiment, the photoluminescent indicia 202 are disposed on the same layer 206 as the component or components including the matrix of electrodes, and then the screen may be integrated to as normal into other devices.

Figure 5F:
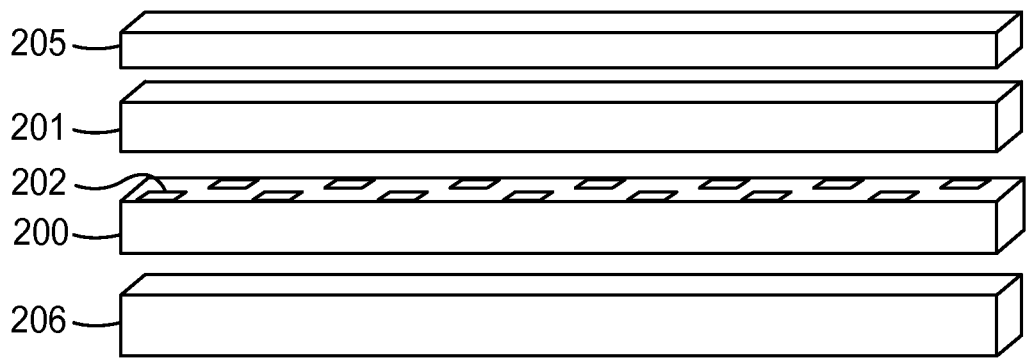
FIG. 5f shows an exemplary product construction.

Yet another option is shown in FIG. 5f, which shows the digitizer panel as an underlay between the cover lens of a touch sensitive screen 205 (in this case a visible light transmissive PCT screen) and the layer 206 that includes the matrix of electrodes, by forming photoluminescent indicia 202 on a visible-light-transparent substrate 200, which could comprise materials such as PET or MOF, and adhering this to the cover glass using a variety of methods known to the art. The resultant stack can then be adhered to the digitizer panel using methods known in the art (for example, by laminating with optically clear adhesive 201).

EXAMPLE

This example describes the set-up that may be used to demonstrate photoluminescent indicia that can be viewed at various stylus angles. It consists of an illumination source, a photoluminescent medium, and an image sensor placed behind a suitable filter. The illumination source comprised a light emitting diode (UVXTZ-400-15 supplied by BIVAR, Inc, of Irving, Calif.), powered with 20 mA of current and placed at a distance of about 3 cm from the substrate on which a luminescent dye was printed to form position-unique photoluminescent indicia. The diode had a spectral emission centered at about 400 nm. Light from the diode was incident on the printed fluorescent dye IRF820A and caused photoluminescent emission. The photoluminescent material comprised IRF820A, which was purchased from QCR Solutions Corp. of Port Saint Lucie, Fla. It came in a powder form with a quantum efficiency quoted at 0.2 for fluorescence between 700 nm and 1000 nm.

As an initial experiment, the fluorescent particles were dispersed at room temperature into OP2001 Matte Varnish resin at a concentration of 0.5% and manually deposited onto a small sample of MOF using a toothpick. The OP2001 Matte Varnish was purchased from the series for UV Flexo Varnishes of Nazdar Company of Shawnee, Kans. The MOF substrate comprised PR90EX manufactured by 3M Corporation of St. Paul, Minn. This particular MOF was high in transmission over the visible range and was highly reflective beyond 850 nm. An optical filter was placed in the path of the light entering a CCD image sensor that was used as an imaging tool in the stylus. The optical filter was a long pass filter, comprising Clarex NIR-75N, supplied by Astra Products of Baldwin, N.Y. This filter suppressed transmission of light wavelengths below 750 nm. As a result, specular reflection from the diode that obscured some indicia in was largely suppressed from reaching the image sensor, while IR light emitted by the fluorescent dye was detected by the image sensor, resulting in a clear image of position-unique photoluminescent indicia on the substrate.

In a further experiment, an illumination source comprised a light emitting diode (L750-04AU supplied by Marubeni America Corporation of Santa Clara Calif.), powered with 20 mA of current and placed at a distance of about 3 cm from the substrate onto which a fluorescent dye was printed to form position-unique photoluminescent indicia. The diode had a spectral emission centered at about 750 nm. Light from the diode was incident on the printed fluorescent dye EviDot Snake Eyes and caused photoluminescent emission. The photoluminescent material comprised EviDot Snake Eyes, which was purchased from Evident Technologies of Troy N.Y. It came in a liquid form of quantum dots in toluene with a quantum efficiency quoted at 0.3 for fluorescence between 400 nm and 1000 nm. As an initial experiment, the fluorescent particles were dispersed at room temperature into Integrity 1100D and manually deposited onto a small sample of PET using screen-printing techniques. The Integrity 1100D was purchased from Hexion Specialty Chemicals of Columbus Ohio by Evident Technologies. The PET substrate comprised ST505 manufactured by Dupont Teijin Films of Chester Va. This particular PET is a clear, heat stabilized polyester film which is pre-treated on both sides for improved adhesion. An optical filter was placed in the path of the light entering a CCD image sensor that was used as an imaging tool in the stylus. The optical filter was a long pass filter, comprising Clarex NIR-85N, supplied by Astra Products of Baldwin, N.Y. This filter suppressed transmission of light wavelengths below 850 nm. As a result, specular reflection from the diode that obscured some indicia in was largely suppressed from reaching the image sensor, while IR light emitted by the fluorescent dye was detected by the image sensor, resulting in a clear image of position-unique photoluminescent indicia on the substrate. These results were achieved at various stylus angles.

The term stylus used herein may include a device that may be moved relative to a digitizer surface. The stylus may have a shape similar to a pen, or a computer mouse, or any shape. Multiple styli may be used simultaneously on a digitizer surface as writing devices, cursor control devices, or game pieces, for example. The stylus may be moved manually or by a mechanical device or a machine. The digitizer surface may be planar, cylindrical, spherical, or any shape.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application.

Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. An optical stylus having a field of view, for sensing position-unique indicia that define local areas of a substrate, comprising:
    a stylus housing extending along a length of the optical stylus;

a first image sensor disposed in the stylus housing and sensitive to radiation received into an end of the stylus housing within a first wavelength range, providing first image signals;

a second image sensor disposed in the stylus housing and sensitive to radiation received into the end of the stylus housing with a second wavelength range, providing second image signals;

a first illumination source disposed in the stylus housing and providing radiation from the end of the stylus housing in a direction along the length of the optical stylus in a first illumination wavelength range;

a second illumination source disposed in the stylus housing and providing radiation from the end of the stylus housing in the direction along the length of the optical stylus in a second illumination wavelength range; and electronics disposed in the stylus housing and communicatively coupled to the first and second image sensors and the first and second illumination sources, the electronics configured to operate in various modes, comprising automatically selectively turning on and off the first and/or second illumination sources while receiving and responding to the first and/or second image signals.

2. The optical stylus of claim 1, wherein the electronics are additionally configured to periodically operate in a mode wherein neither the first nor second illumination sources are driven while first and second image signals are received.

3. The optical stylus of claim 1, wherein the electronics are configured to determine, from the received first and second image signals, if a supported indicia pattern is within the stylus' field of view.

4. The optical stylus of claim 3, wherein the electronics are further configured to, once a supported location pattern has been detected, automatically switch to a sensing mode that is consistent with the detected indicia.

5. The optical stylus of claim 4, wherein consistent with the detected indicia comprises selecting the sensing mode that includes activating either the first or the second illumination sources or neither of them, and either the first or the second image sensors.

6. The optical stylus of claim 5, wherein the first wavelength range is substantially human visible.

7. The optical stylus of claim 6, wherein substantially human visible comprises from about 360 nm to about 700 nm.

8. The optical stylus of claim 6, wherein the second wavelength range is substantially infrared.

9. The optical stylus of claim 8, wherein substantially infrared comprises from about 700 nm to 2000 nm.

10. The optical stylus of claim 8, wherein the first and second image sensors are the same image sensor.

11. The optical stylus of claim 8, further comprising:
a filter associated with the second image sensor, the filter passing mostly infrared radiation from the field of view to the second image sensor.

12. The optical stylus of claim 8, wherein the first illumination wavelength range is substantially human visible.

13. The optical stylus of claim 12, wherein substantially human visible comprises from about 300 nm to about 700 nm.

14. The optical stylus of claim 1, further comprising:
an achromatic lens.

15. An optical stylus comprising:
a stylus housing extending along a length of the optical stylus;

an image sensor disposed in the stylus housing and having a field of view;

a first and a second illumination source disposed in the stylus housing, the first illumination source configured to provide radiation in a first illumination wavelength range, and the second illumination source configured to provide excitation radiation in a second illumination wavelength range; and electronics disposed in the stylus housing and communicatively coupled to the image sensor and the first and second illumination sources, the electronics configured to receive image signals from the image sensor and to determine therefrom whether an image signal comprises a supported indicia pattern, wherein the electronics are further configured to selectively cycle the first and second illumination sources to find which causes an image signal comprising a supported indicia pattern to be received by the image sensor.

16. An optical stylus for sensing a pattern of indicia comprising:
a stylus housing extending along a length of the optical stylus;

a first light source disposed in the stylus housing and configured to emit radiation within a first illumination wavelength range;

a second light source disposed in the stylus housing and configured to emit radiation within a second illumination wavelength range; and an optical image sensor disposed in the stylus housing and configured to sense indicia in a first indicia wavelength range and in a second indicia wavelength range, the first indicia wavelength range comprising substantially human visible light, and the second indicia wavelength range comprising substantially non-human visible radiation, wherein the optical stylus is configured to operate in a plurality of modes, the plurality of modes comprising: a first mode for reading photoluminescent indicia wherein the first light source is turned off and the second light source is turned on; a second mode for reading light absorbing indicia on a light diffusing or reflective substrate wherein the first light source is turned on and the second light source is turned off; and a third mode for reading indicia displayed on a display wherein the first and second light sources are turned off.

17. The optical stylus of claim 16, further comprising an achromatic lens.

18. The optical stylus of claim 16, wherein the first illumination wavelength range does not overlap with either the first or second indicia wavelength ranges.

19. The optical stylus of claim 16, wherein the first illumination wavelength range at least partially overlaps with the first and/or second indicia wavelength ranges.

20. The optical stylus of claim 16, wherein the first illumination wavelength range is substantially infrared.

21. The optical stylus of claim 16, wherein the first illumination wavelength range is substantially human visible.

22. The optical stylus of claim 21, wherein human visible is 360 nm to 700 nm.

23. The optical stylus of claim 16, wherein the second indicia wavelength range is substantially infrared.

24. The optical stylus of claim 16 further comprising electronics configured to automatically switch between the first, second and third modes.

25. The optical stylus of claim 24, wherein the electronics are further configured to automatically sequentially switch between the first, second and third modes until a supported pattern of indicia is detected.

26. The optical stylus of claim 16, wherein the optical image sensor is a single sensor.

27. The optical stylus of claim 16, wherein the optical image sensor comprises an array of pixels.

28. The optical stylus of claim 27, wherein a first sub-array of the array of pixels is responsive to the first indicia wavelength range, and a second sub-array of the array of pixels is responsive to the second indicia wavelength range.

29. The optical stylus of claim 28, further comprising:
a filter that passes radiation within the first indicia wavelength range to the first sub-array of pixels and radiation of the second indicia wavelength range to the second sub-array of pixels.

\* \* \* \* \*

UNITED STATES PATENT AND TRADEMARK OFFICE
CERTIFICATE OF CORRECTION

PATENT NO. : 10,753,746 B2
APPLICATION NO. : 13/713032
DATED : August 25, 2020
INVENTOR(S) : Bernard Geaghan Page 1 of 1

It is certified that error appears in the above-identified patent and that said Letters Patent is hereby corrected as shown below:

On the Title Page

In Column 1, Under (73) Assignee:
Delete "3M Innovative Properties, Inc." and insert -- 3M Innovative Properties Company --, therefore.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*